US006885032B2

(12) United States Patent
Forbes et al.

(10) Patent No.: US 6,885,032 B2
(45) Date of Patent: Apr. 26, 2005

(54) DISPLAY ASSEMBLY HAVING FLEXIBLE TRANSISTORS ON A FLEXIBLE SUBSTRATE

(75) Inventors: Charles Forbes, Edgewater, NJ (US); Alexander Gelbman, West Orange, NJ (US); Helena Gleskova, Princeton, NJ (US); Christopher Turner, Belmont, MA (US); Sigurd Wagner, Princeton, NJ (US)

(73) Assignee: Visible Tech-Knowledgy, Inc., West Orange, NJ (US)

( * ) Notice: Subject to any disclaimer, the term of this patent is extended or adjusted under 35 U.S.C. 154(b) by 0 days.

(21) Appl. No.: 10/300,514

(22) Filed: Nov. 20, 2002

(65) Prior Publication Data

US 2003/0134460 A1 Jul. 17, 2003

Related U.S. Application Data

(60) Provisional application No. 60/382,314, filed on May 21, 2002, provisional application No. 60/374,131, filed on Apr. 19, 2002, provisional application No. 60/333,838, filed on Nov. 28, 2001, and provisional application No. 60/350,584, filed on Nov. 21, 2001.

(51) Int. Cl.$^7$ .............................................. H01L 29/04
(52) U.S. Cl. ...................... 257/72; 349/112; 349/113
(58) Field of Search ................................ 349/112, 113; 257/72, 59

(56) References Cited

U.S. PATENT DOCUMENTS

| | | | |
|---|---|---|---|
| 4,126,854 A | 11/1978 | Sheridon | ..................... 340/373 |
| 4,143,103 A | 3/1979 | Sheridon | ....................... 264/4 |
| 4,298,448 A | 11/1981 | Müller et al. | ........... 204/299 R |
| 4,435,047 A | 3/1984 | Fergason | .................... 350/334 |
| 5,213,853 A | 5/1993 | Noonan | ......................... 428/1 |
| 5,262,098 A | 11/1993 | Crowley et al. | ............... 264/8 |
| 5,344,594 A | 9/1994 | Sheridon | ..................... 264/4.1 |
| 5,437,811 A | 8/1995 | Doane et al. | .......... 252/299.01 |
| 5,641,974 A | 6/1997 | den Boer et al. | ............. 257/59 |
| 5,680,185 A | 10/1997 | Kobayashi et al. | ........... 349/88 |
| 5,729,242 A | 3/1998 | Margerum et al. | ............. 345/7 |
| 5,751,257 A | 5/1998 | Sutherland | ..................... 345/2 |
| 5,776,803 A | 7/1998 | Young | ........................ 438/149 |
| 5,796,121 A | 8/1998 | Gates | ........................... 257/59 |
| 5,825,529 A | 10/1998 | Crowley | ..................... 359/296 |
| 5,856,858 A | 1/1999 | Carey et al. | ................. 349/158 |
| 6,025,896 A | 2/2000 | Hattori et al. | ................ 349/86 |

(Continued)

FOREIGN PATENT DOCUMENTS

| | | |
|---|---|---|
| EP | 1058147 A2 | 12/2000 |
| WO | WO 98/03896 A1 | 1/1998 |
| WO | WO 98/41898 A2 | 9/1998 |
| WO | WO 99/10769 A1 | 3/1999 |

(Continued)

OTHER PUBLICATIONS

Baeuerle et al. "4.3: A MIM–driven transmissive display with color filters on 2–in.–diagonal plastic substrates." SID 99 Digest pp. 414–417.

(Continued)

*Primary Examiner*—Fetsum Abraham
(74) *Attorney, Agent, or Firm*—Lahive & Cockfield, LLP

(57) ABSTRACT

A thin film transistor array fabricated on a polyimide substrate forms a backplane for an electronic display. The thin film transistor array incorporates gate electrodes, a gate insulating layer, semiconducting channel layers deposited on top of the gate insulating layer, a source electrode, a drain electrode and a contact layer beneath each of the source and drain electrodes and in contact with at least the channel layer. An insulating encapsulation layer is positioned on the channel layer. The layers are deposited onto the polyimide substrate using PECVD and etched using photolithography to form the backplane.

49 Claims, 16 Drawing Sheets

U.S. PATENT DOCUMENTS

| | | | |
|---|---|---|---|
| 6,080,606 A | 6/2000 | Gleskova et al. | 438/151 |
| 6,087,196 A | 7/2000 | Sturm et al. | 438/29 |
| 6,089,453 A | 7/2000 | Kayser et al. | 235/383 |
| 6,118,426 A | 9/2000 | Albert et al. | 345/107 |
| 6,124,851 A | 9/2000 | Jacobson | 345/206 |
| 6,140,899 A | 10/2000 | Kayser et al. | 335/220 |
| 6,181,299 B1 | 1/2001 | Frederick et al. | 345/1 |
| 6,204,902 B1 * | 3/2001 | Kim et al. | 349/112 |
| 6,253,190 B1 | 6/2001 | Sutherland | 705/20 |
| 6,307,751 B1 * | 10/2001 | Bodony et al. | 361/749 |

FOREIGN PATENT DOCUMENTS

| | | |
|---|---|---|
| WO | WO 00/16189 A1 | 3/2000 |
| WO | WO 00/26761 A1 | 5/2000 |
| WO | WO 00/36465 A1 | 6/2000 |
| WO | WO 00/36666 A1 | 6/2000 |
| WO | WO 00/46854 A1 | 8/2000 |
| WO | WO 00/49421 A1 | 8/2000 |
| WO | WO 00/49658 A1 | 8/2000 |
| WO | WO 00/55915 A1 | 9/2000 |
| WO | WO 00/55916 A1 | 9/2000 |
| WO | WO 00/67110 A1 | 11/2000 |
| WO | WO 00/67327 A1 | 11/2000 |
| WO | WO 01/07961 A1 | 2/2001 |
| WO | WO 01/08241 A1 | 2/2001 |
| WO | WO 01/08242 A1 | 2/2001 |
| WO | WO 01/17029 A1 | 3/2001 |
| WO | WO 01/17040 A1 | 3/2001 |
| WO | WO 01/17041 A1 | 3/2001 |
| WO | WO 01/33621 A2 | 5/2001 |
| WO | WO 01/80287 A2 | 10/2001 |

OTHER PUBLICATIONS

Chen et al. "12.2: A conformable electronic ink display using a foil–based a–Si TFT array." SID 01 Digest pp. 157–159.

Comiskey et al. "An eletrophoretic ink for all–printed reflective electronic displays." Nature 1998;394:253–255.

Forbes et al. "43.3: A rugged conformable backplane fabricated with an a–Si:H TFT array on a polyimide substrate." SID 02 Digest pp. 1–4.

Gleskovà et al. "Electrophotographic patterning of a–Si:H." Mat. Res. Soc. Symp. Proc. 1995;377:719–724.

Gleskovà et al. "Electrophotographic patterning of thin–film silicon on glass foil." IEEE Electron Device Letters 1995;16(10):418–420.

Gleskovà et al. "Electrophotographic patterning of a–Si:H." AMLCDs 1995 Workshop Proceedings 1995 pp. 16–19.

Gleskovà et al. "Electrophotographically patterned thin–film silicon transistors." IEEE Electron Device Letters 1996;17(6):264–266.

Gleskovà et al. "a–Si:H TFT fabricated by electrophotographic printing." Display Manufacturing Technology Conference. Digest of Technical Papers. 1996 pp. 97–98.

Gleskovà et al. "a–Si:H TFTs patterned using laser–printed toner." Mat. Res. Soc. Symp. Proc. 1997;424:71–76.

Gleskovà et al. "a–Si:H TFTs made on polyimide foil by pe–cvd at 150° C." Mat. Res. Soc. Symo. Proc. 1998;508:73–78.

Gleskovà et al. "Photoresist–free fabrication process for a–Si:H thin film transistors." Journal of Non–Crystalline Solids 1998;227–230:1217–1220.

Gleskovà et al. "Rugged a–Si:H TFTs on plastic substrates." Mat. Res. Soc. Symp. Proc. 1999;557:653–658.

Gleskovà et al. "Amorphous silicon thin–film transistors on compliant polyimide foil substrates." IEEE Electron Device Letters 1999;20(9):473–475.

Gleskovà et al. "Failure resistance of amorphous silicon transistors under extreme in–plane strain." Applied Physics Letters 1999;75(19):3011–3013.

Gleskovà et al. "a–Si:H thin film transistors after very high strain." Journal of Non–Crystalline Solids 2000;266–269:1320–1324.

Gleskovà et al "a–Si:H TFTs on polyimide foil: Electrical performance under mechanical strain." Asia Display/IDW '01 2001:331–334.

Gleskovà et al. "Low–temperature silicon nitride for thin-film electronics on polyimide foil substrates." Applied Surface Science 2001;175–176:12–16.

Gleskovà et al. "Electrical stability of a–Si:H TFTs fabricated at 150° C." . Res. Soc. Symp. Proc. 2001;664:A19.7.1–A19.7.6.

Gleskovà et al. "150° C. Amorphous silicon thin–film transistor technology for polyimide substrates." Journal of the Electrochemical Society 2001;148(7):G370–G374.

Gleskovà et al. "DC–gate–bias stressing of a–Si:H TFTs fabricated at 150° C. on polyimide foil." IEEE Transactions on electron devices 2001;48(8):1667–1671.

Gleskovà et al. "Electrophotographically printed insulator." Materials Letters 2002;52:150–153.

Gleskovà et al. "Electrical response of amorphous silicon thin–film transistors under mechanical strain." Journal of applied physics 2002;92(10):6224–6229.

Gleskovà et al. "Effects of mechanical strain on amorphous silicon thin–film transistors." Mat. Res. Soc. Symp. Proc. 2002;715:667–677.

Gleskovà et al. "Electron mobility in amorphous silicon thin–film transistors under compressive strain." Applied Physics Letters 2001;79(20):3347–3349.

Hsu et al. "Amorphous Si TFTs on plastically deformed spherical domes." Journal of Non–Crystalline Solids 2002;299–302:1355–1359.

Sazonov et al. "Fabrication of a–Si:H TFTs at 120° C. on flexible polymide substrates." Mat. Res. Soc. Symp. Proc. 2000;558:375–381.

Shen et al. "Patterning of a–Si:H by laser printing." SID Digest of technical Papers 1995 pp. 587–590.

Sturm et al. "Three–dimensional electronic surfaces." Mat. Res. Soc. Symp. Proc. 2001;636:D11.4.1–D11.4.12.

Sturm et al. "Enabling technologies for plastic displays." Proc. SPIE 2002;4712:222–236.

Suo et al. "Mechanics of rollable and foldable film–on–foil electronics." Applied Physics Letters 1999;74(8):1177–1179.

Theiss et al. "Polysilicon thin film transistors fabricated at 100° C. on a flexible plastic substrate." IEDM 1998 257–260.

Thomasson et al. "Tri–layer a–Si: H TFTs on polymeric substrates." 56th Device Research Conference Digest, Jun. 1998, pp. 126–127.

Wagner et al. "Compliant substrates for thin–film transistor backplanes." in Flat panel display technology and display metrology Proceedings of SPIE 1999;3636:32–39.

Wagner et al. "Low temperature amorphous and nanocrystalline silicon technology for flat panel displays." SID 20$^{th}$ International Display Research Conference 2000 pp. 402–405.

Wagner et al. "Novel processing technology for macroelectronics." In *Technology and applications of amorphous silicon*, Street (ed.) Springer 2000 pp. 222–251.

Wagner et al. "Silicon thin–film transistors on flexible foil substrates." *IMID '02 Digest of Technical Papers* pp. 263–267.

Wagner et al. "Thin–film transistors and flexible electronics." In *Growth, characterization and electronic applications of Si–based thin films* Bergmann (ed.) 2002 pp. 1–14.

Wagner et al. "Silicon for thin–film transistors." $2^{nd}$ *International Conference on Cat–CVD (hot–wire CVD) process* 2002 pp. 1–6.

Baeuerle et al. "4.3: A MIM–driven transmissive display with color filters on 2–in.–diagonal plastic substrates." SID 99 Digest pp. 414–417.

Chen et al. "12.2: A conformable electronic ink display using a foil–based a–Si TFT array." SID 01 Digest pp. 157–159.

Comiskey et al. "An eletrophoretic ink for all–printed reflective electronic displays." *Nature* 1998;394:253–255.

Forbes et al. "43.3: A rugged conformable backplane fabricated with an a–Si:H TFT array on a polyimide substrate." SID 02 Digest pp. 1–4.

Glesková et al. "Electrophotographic patterning of a–Si:H." *Mat. Res. Soc. Symp. Proc.* 1995;377:719–724.

* cited by examiner

DISPLAY ASSEMBLY HAVING FLEXIBLE TRANSISTORS ON A FLEXIBLE SUBSTRATE

RELATED APPLICATIONS

This application claims priority to provisional patent application Ser. No. 60/350,584 entitled "A Flexible Display Utilizing a Thin Film Transistor Array on a Polyimide Substrate" filed Nov. 21, 2001, provisional patent application Ser. No. 60/333,838 entitled "A Flexible Display or Imaging Area Utilizing a Thin Film Transistor Array on a Polyimide Substrate" filed Nov. 28, 2001, provisional patent application Ser. No. 60/374,131 filed Apr. 19, 2002 and provisional patent application Ser. No. 60/382,314 filed May 21, 2002. The present application is related to U.S. Provisional Patent Application Ser. No. 60/099,888 entitled "Remotely Updateable and Alterable Electronic Display Based Products And Systems", filed September 11, 1998, U.S. patent application Ser. No. 09/393,553 entitled "Smart Electronic Label Employing Electronic Ink", filed Sep. 10, 1999, U.S. patent application Ser. No. 09/760,363 entitled "Smart Electronic Label Employing Electronic Ink", filed Jan. 12, 2001 and U.S. patent application Ser. No. 10/071,732 filed Feb. 7, 2002 entitled "Smart Electronic Label Employing Electronic Ink". The aforementioned applications, and the references cited therein, are incorporated herein by reference.

FIELD OF THE INVENTION

The present invention is directed to electronic display devices. More particularly, the present invention is directed to an active matrix thin film transistor array backplane for an electronic display device and a method of fabricating an active matrix thin film transistor array backplane on a polyimide substrate.

BACKGROUND OF THE INVENTION

Recently, there has been considerable interest in the development of thin flexible electronic displays utilizing either steel or plastic based backplanes for driving the display. Currently, many active matrix displays use glass as a substrate material. However, the use of glass has many drawbacks, including that the glass is heavy, inflexible and fragile. With the elimination of fragile glass substrates, it becomes possible to develop new devices for the growing market of lightweight electronic products. Such products include pagers, smart cell phones, radio frequency identification (RFID) tags, and smart cards. Flexible substrates are compatible with efficient manufacturing methods such as roll to roll processing and photoresist-free fabrication techniques that can lower overall manufacturing costs and make the concept of "electronic paper" a reality.

Electro nic labels comprise a transistor backplane built on a substrate and a functional front plate including a display material forming a display. Because the functional planes are only micrometers thick, the weight of macroelectronic systems is as light as their substrate and encapsulation will allow.

SUMMARY OF THE INVENTION

The present invention provides a working active matrix thin film transistor array formed on a polyimide substrate. The array forms a backplane for addressing an electronic display. The thin film transistor array incorporates gate electrodes, a gate insulating layer, semiconducting channel layers deposited on top of the gate insulating layer, a source electrode, a drain electrode and a contact layer beneath each of the source and drain electrodes. An insulating encapsulation layer is positioned on the channel layer. The layers are deposited onto the polyimide substrate using plasma enhanced chemical vapor deposition (PECVD) and etched using photolithography to form the backplane.

The thin film transistor array may be used to form an electronic display de vice by laminating, attaching or applying a display medium, such as electronic ink, polymer dispersed liquid crystal or other display medium, to the thin film transistor array backplane. The display medium is sandwiched between the thin-film transistor array and a top sheet of ITO-coated polyester to form a pixel-addressable display for displaying information. An alternative design utilizes a wand or stylus as the reference electrode, which activates the corresponding pixel or pixels on the thin-film transistor array as it passes over them. The electronic display device using the thin-film transistor array backplane may be used to form black and white or color displays.

The resulting form factor is thin, flexible and malleable. It can be fabricated to conform or contour to any shape. Its flexibility allows for devices to be designed that incorporates retractable or roll up displays.

The active matrix thin film transistor array on a polyimide substrate described herein can be combined with any other class of electronically activated materials used to form images to create thin flexible displays. Suitable materials include organic light emitting diodes (OLEDs), traditional liquid crystals, and non volatile liquid crystals such as; Cholesteric, Fast Multi Stable Liquid Crystals (FMLCD), Bi-stable nematic liquid crystal, Zenithal, as well as ferroelectric, Onyx™ materials.

The thin film transistor array of the present invention may be used in large area electronics, such as electrophoretic information displays which are flexible, lighter in weight and more impact resistant than displays fabricated on traditional glass substrates. The thin film transistor array may be used in creating the display or imaging area for smart, flexible, thin radio frequency driven (RFID) labels; smart, flexible, thin radio frequency driven (RFID) tags or smart electronic labels employing electronic ink, or any non-volatile display medium; or any type of smart or plain card involving a contactless (wireless) connection to an on-board chip employing electronic ink, or any non-volatile display medium.

According to one aspect, a method of fabricating a thin film transistor active matrix backplane is provided. The method comprises the steps of providing a polyimide substrate in a plasma enhanced chemical vapor deposition chamber; depositing a first passivation layer to passivate the substrate using plasma enhanced chemical vapor deposition; applying a gate material to the first passivation layer by e-beam evaporation; patterning the gate material using photolithographic techniques to form an array of gate electrodes; depositing a gate insulating layer over the gate electrodes and first passivation layer; depositing a semiconducting channel layer comprising amorphous silicon over the gate insulating layer using plasma enhanced chemical vapor deposition; depositing a contact layer comprising phosphorus doped amorphous silicon on the semiconducting channel layer using plasma enhanced chemical vapor deposition; depositing a source-drain layer on the contact layer; patterning an array of source electrodes, drain electrodes, lines and pads in the source-drain layer using photolithography, patterning an array of transistor islands on the source and drain electrodes using photolithography; depositing a protective layer on the source-drain layer; and exposing the drain electrodes and pads.

According to another aspect, a polymer dispersed electronic display is provided. The display comprises a backplane comprising an active matrix thin film transistor array formed on a flexible polyimide substrate; a top layer of indium tin oxide coated polyester; and a middle layer disposed between the backplane and the top plane comprising a 20:80 mixture of prepolymer PN393 and TL213. The middle layer is cured using a light source.

According to another aspect of the invention, a method of making a polymer dispersed electronic display is provided. The method comprises the steps of providing an active matrix thin film transistor array backplane formed on a polyimide substrate; depositing a display medium on the active matrix thin film transistor array backplane; depositing a protective layer comprising indium tin oxide coated polyester over the display medium; and curing the display medium between the backplane and the protective layer.

According to yet another aspect, a thin film transistor backplane is provided. The backplane comprises a polyimide substrate, a first passivation layer deposited on a deposition surface of the polyimide substrate, an array of gate electrodes and gate lines patterned on the passivation layer, a gate insulating layer deposited over the array of gate electrodes and gate lines; a semiconducting channel layer deposited over the gate insulating layer, a contact layer deposited on and in contact with the channel layer and an array of source electrodes, drain electrodes, lines and pads fabricated on and in contact with the contact layer.

BRIEF DESCRIPTION OF THE DRAWINGS

The foregoing and other objects, features and advantages of the invention will be apparent from the following description and apparent from the accompanying drawings, in which like reference characters refer to the same parts throughout the different views.

The drawings illustrate principles of the invention and, although not to scale, show relative dimensions.

In FIG. 4, four complete pixels are shown.

DESCRIPTION OF ILLUSTRATED EMBODIMENTS

The present invention provides an improved active matrix backplane comprising an array of amorphous silicon thin-film transistors fabricated on a polyimide substrate. The thin-film transistor components are deposited on the polyimide substrate by plasma enhanced chemical vapor deposition. The present invention will be described below relative to an illustrative embodiment. Those skilled in the art will appreciate that the present invention may be implemented in a number of different applications and embodiments and is not specifically limited in its application to the particular embodiments depicted herein.

Figure 1:
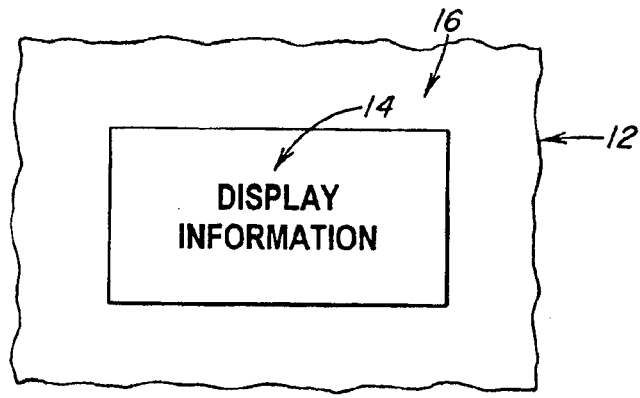
FIG. 1 illustrates an electronic label suitable for implementing an illustrative embodiment of the present invention.

FIG. 1 is a broad illustration of an electronic label suitable for implementing the thin-film transistor active matrix backplane of an illustrative embodiment of the invention. The electronic label may be employed in connection with an item, person, animal or location in accordance with the teachings of the present invention. The illustrated electronic label 16 is specifically employed in connection with an item 12. The electronic label 16 displays information, generally as human or machine readable indicia 14, in order to display information related to the item 12 or any other predefined or selected information. The electronic label 16 can be temporarily or permanently affixed, attached, secured or coupled to the item 12 according to known methods and techniques. According to one practice, a suitable conventional mechanical fastening system, such as fasteners, loop and hook-type arrangements, stitches, adhesives, and molding, as well as other known fixation techniques, can be employed to permanently or temporarily attach the electronic label 16 to the item 12. The label can also be integrally formed with the item, or can be used as a stand alone label. As used herein, the term label is intended to include a label, strip, tag or general display device that is sufficiently sized and configured for attachment to an animal, person, item, or location for displaying indicia. For purposes of clarity, the label 16 is generally shown and described as being attached to an item, although those of ordinary skill will readily recognize that the label can also be attached to an animal, person or location. The label may also be a stand alone display that is not mounted to anything, such as business cards or trading cards. Alternatively, the label may comprise electronic paper writing for drawing, printing, copying or faxing.

The illustrated electronic label 16 displays information that is either wholly or partly prestored or preloaded, or uploaded, in the label, or created by a processor in the label, or displays information that corresponds or is consistent with or based upon signals received from an external source, such as an activator module and/or a GPS system. Those of ordinary skill will readily recognize that the information displayed by the electronic label 16 can be any general information corresponding to the item, location, mammal or non-mammal, and which is suitable and appropriate for a particular intended use.

Figure 2A:
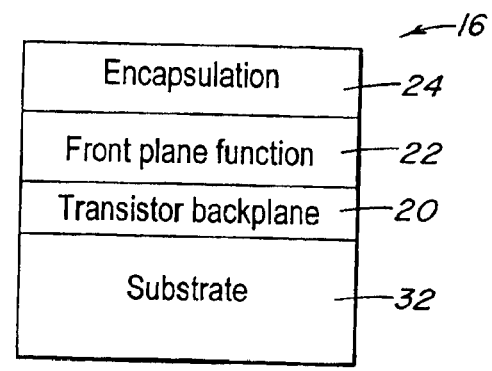
FIGS. 2a and 2b illustrate an electronic label including a backplane of the present invention.
Figure 2B:
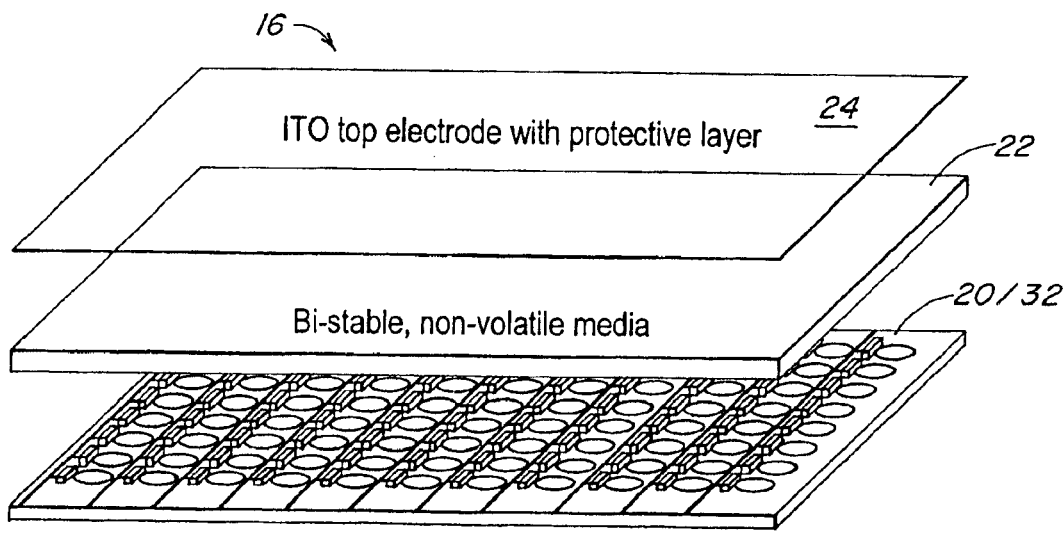

As shown in FIGS. 2a and 2b, the electronic label 16 comprises a transistor backplane 20 built on a substrate 21 and a functional front plane 22 comprising a display medium forming a pixel addressable display. Each pixel of the display assembly can be individually altered by a thin-film transistor in the array of thin-film transistors in the activation grid matrix. A thin-film transistor is formed on each pixel region for addressing the corresponding pixel in the display. Each thin-film transistor controls or measures the voltage imposed on each pixel. Each transistor is in turn controlled by a matrix of gate lines and data lines. To form the electronic label, the transistor backplane is first built on a substrate. The functional front plane (display material) 22 is added on top of the transistor backplane and a top electrode 24, comprising, for example ITO (indium tin oxide) or similar transparent conducting material on a substrate is deposited over the display layer 22. This may or may not be covered by a protection layer that encapsulates the structure and protects the components. Alternatively the top electrode 24 can be a hand held or mechanically moved wand or stylus. According to the illustrative embodiment, the transistor backplane 20 comprises an array of silicon-based thin film transistors to form an active matrix for controlling the display. Each pixel can be selectively activated to form a desired symbol, indicia, number, bar code and so on.

The display medium used in the front plane 22 may comprise any suitable electronically activated (current or voltage) flexible display or imaging material known in the art. The display medium can be bi-stable, non-volatile or stable only when power is applied or very slow to change after power is removed. The display medium may be used to form black and white or color images and may comprise a single or multiple transistors per pixel. According to one embodiment, the display medium in the front plane can be any material that changes state in response to a current or voltage, including, but not limited to LCD, OLED, phosphorus, electrophoretic ink, flexible cholesteric, rigid cholesteric, Gyricon™, micro-encapsulated Gyricon balls, E Ink™ material, a polymer dispersed liquid crystal (PDLC) film, and non volatile liquid crystals such as; Cholesteric, Fast Multi Stable Liquid Crystals (FMLCD), Bi-stable nematic liquid crystal, Zenithal, as well as ferroelectric, Onyx™ materials and so on. Suitable materials are described in U.S. patent application Ser. No. 09/393,553, filed Sep. 10, 1999, U.S. patent application Ser. No. 09/760,363, filed Jan. 12, 2001 and U.S. patent application Ser. No. 10/071,732 filed Feb. 7, 2002, the contents of all of which are herein incorporated by reference.

The pixels in the display may have any size, area and shape, including, but not limited to square, round, hexagonal or any other type of polygon. The number of pixels and overall size and shape of the addressable matrix can be increased according to the particular application.

Figure 2C:
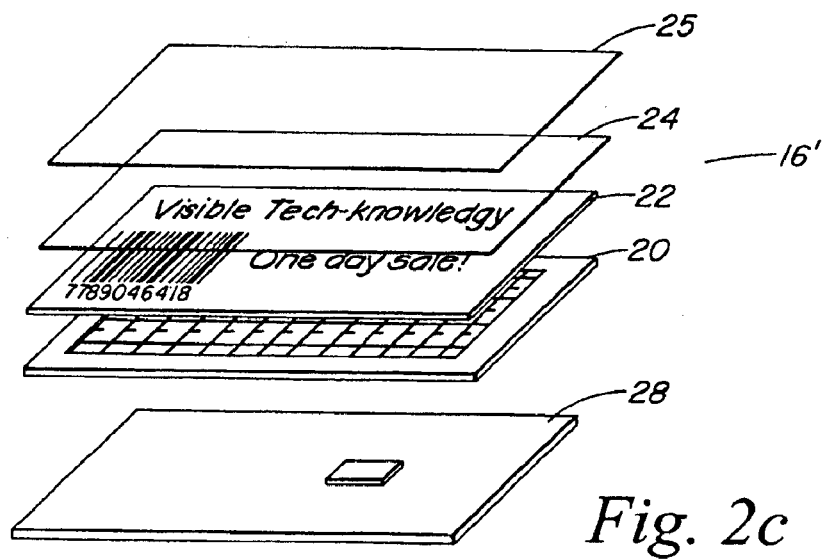
FIG. 2c shows an electronic label including an RFID layer and employing the backplane of the present invention according to another embodiment.

FIG. 2c illustrates an electronic label 16' including an RFID layer according to anther embodiment of the invention. As shown, the label 16' includes an RFID layer 28, a layer comprising an active matrix grid 20, a layer 22 comprising a display medium, a layer 24 comprising a reference electrode, and a top protection layer 25.

In the label 16' of FIG. 2c, the row and column lines in the backplane layer 20 connect to pads on integrated circuits in the RFID layer 28. The driver and addressing circuits can be located in the integrated circuit chips, created by using discrete components or fabricated during the backplane manufacturing process directly on to the backplane substrate material.

Figure 3:
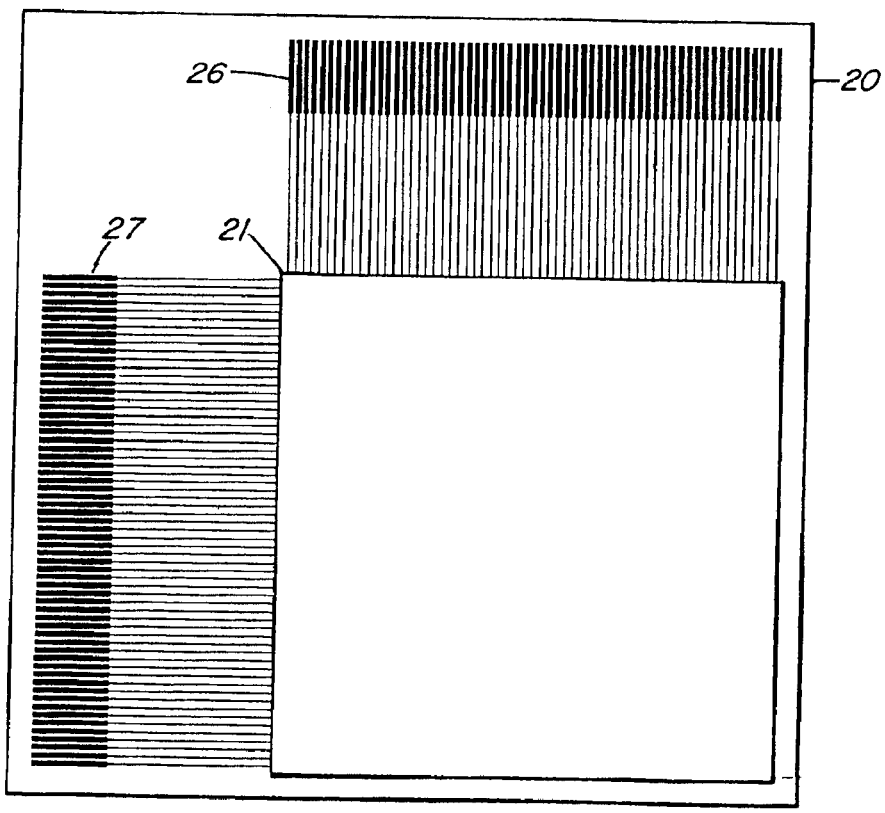
FIG. 3 is a top view of the thin film transistor array backplane of an illustrative embodiment of the invention, showing the pads and general display area.

FIG. 3 is a top view of the transistor backplane 20 of an illustrative embodiment of the invention. As shown, the transistor back plane 20 includes a matrix of gate lines 27 and data lines 26 for controlling each thin-film transistor in the array, thereby forming the pixel addressable, active matrix. The gate lines and data lines that form the addressable, active matrix backplane 21 can be connected with drive circuitry (not shown) using routing and connecting methods known in the art.

Figure 4:
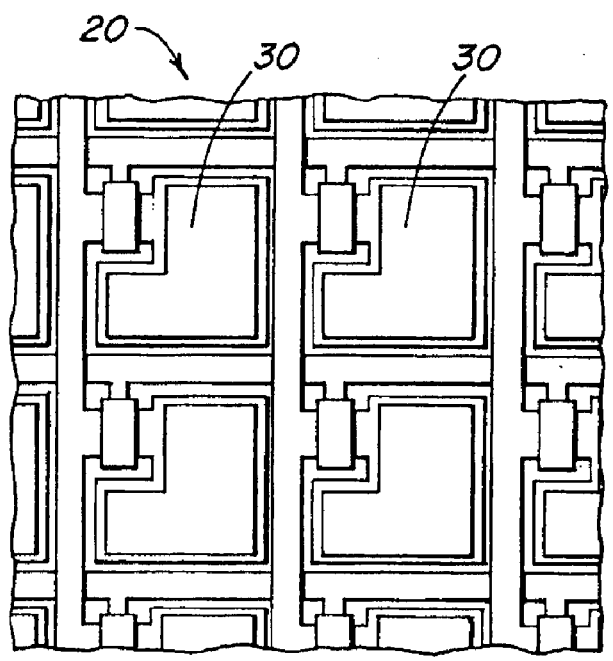
FIG. 4 is an overhead view of the thin film transistor array backplane, showing the pixel structure.

FIG. 4 illustrates an overhead view of a portion of the backplane 20, illustrating the pixel structure of the backplane 20 according to an illustrative embodiment of the invention. As shown, the backplane 20 comprises an array of pixels 20 formed by thin-film transistors 30, four of which are completely shown in FIG. 4.

Figure 5:
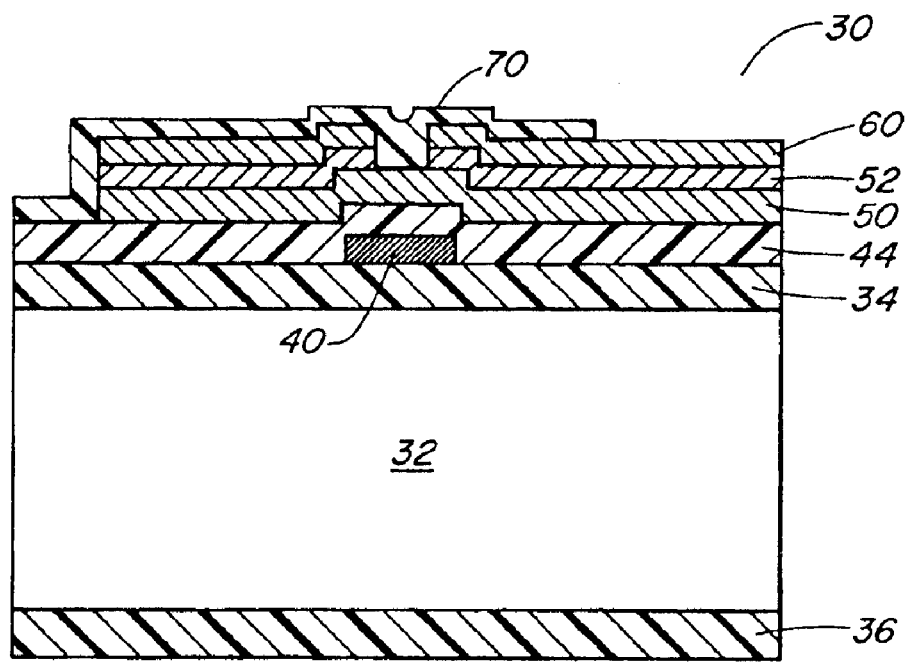
FIG. 5 is a schematic cross-section of a single transistor of the thin film transistor array backplane in one pixel region according to an illustrative embodiment of the invention.
Figure 6:
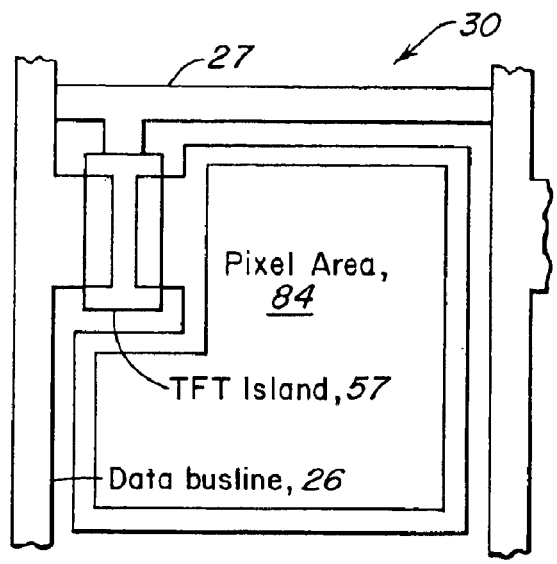
FIG. 6 is an overhead view of a single pixel region of a thin film transistor array backplane of the present invention.

FIG. 5 illustrates a schematic cross-sectional view through a single integrated transistor 30 of the pixel array forming the active matrix thin-film transistor array backplane 20. FIG. 6 is an overhead view of the backplane layout in a single pixel region. The transistor comprises a plurality of layers stacked on top of each other and patterned to define the thin-film transistor structure. At each pixel element, the thin-film transistors have a bottom gate, back-channel etch structure. As shown, each transistor 30 includes a flexible polyimide substrate 32 having a first passivation layer 34 on a top surface and a second passivation layer 36 on the bottom surface of the substrate 32. According to the illustrative embodiment, the polyimide substrate is Kapton E film, manufactured by DuPont, and the passivation layers 34, 36 comprise $SiN_x$. The transistor 30 further includes a patterned layer of gate material 40 forming a gate electrode and line. According to the illustrative embodiment, the gate material 40 comprises a bilayer of aluminum (Al) and Chromium (Cr) deposited on the surface of the first passivation layer 34. A gate insulating layer 44 is deposited over the patterned gate electrode layer 40 and top passivation layer 34. According to the illustrative embodiment, the insulating layer 44 comprises $SiN_x$, as well. The transistor 30 further includes one or more semiconducting channel layers 50 deposited over the gate insulating layer 44. The illustrative semiconducting channel layer 50 comprises amorphous silicon (a-Si:H) deposited over the insulating layer 44. A contact layer 52, illustrated as a layer of phosphorus doped amorphous silicon ((n+)a-Si:H), is deposited on the channel layer 50. A source-drain layer 60 is deposited over the contact layer and patterned to define source and drain electrodes, lines (82 in FIG. 6) and pads (84 in FIG. 6) for the thin-film transistor. The contact layer 52 is disposed between the source and drain lines 60 of the thin-film transistor. The layers are etched to define the thin-film transistor structures. The top layer 70 of the transistor comprises a protective layer for protecting the components of the transistor and providing electrical insulation to the source lines and transistor islands.

The layers are etched to define a thin-film transistor island 57 in the channel layer 50, the pixel areas, gate buslines 25 and data buslines 26. The protective top layer 70 is etched to remove unwanted material over the drain pads 84 of the thin-film transistor 30 to expose the active pixel areas.

According to an illustrative embodiment, the thin-film transistor array is fabricated by sequentially depositing and patterning the various layers on the prepared polyimide substrate 32. According to the illustrative embodiment, the handling of the polyimide substrate 32 during fabrication of the thin-film transistor array is done as free standing film. Unlike prior fabrication techniques, the polyimide substrate 32 is not glued to a solid support followed by processing, but rather, attached by clips at the corners or held at the edges using any suitable fastening technique during certain processes, such as photolithography and deposition. During spin coating, the sample, including the polyimide substrate 32, may be held in place using an aluminum plate having an array of small holes connected to the vacuum source of the spin coater. The force generated by the vacuum holds the sample in place on the aluminum plate during spinning.

According an illustrative embodiment, the polyimide substrate 32, comprising a Kapton® film, is first cleaned prior to deposition of the various layers. In a first step, the polyimide substrate 32 may be initially cleaned with deionized water in an ultrasonic bath, such as the Branson 3510 Ultrasonic Bath. The polyimide substrate 32 may then be placed in a plasma enhanced chemical vapor deposition (PECVD) chamber, such as a multi-chamber S900 PECVD manufactured by System Innovative Systems Engineering, to clean the deposition surface of the polyimide substrate 32. The deposition surface may be cleaned by exposing the substrate to an argon plasma. According to one embodiment, the surface is exposed to the argon plasma for about two minutes at a pressure of between about 0.1 and about 1.0 Torr and preferably 0.5 Torr and an rf power density of about 0.01 to about 0.05 and preferably 0.022 watts per centimeter squared at between about 100° Celsius and about 250° Celsius and preferably at about 150° Celsius. One skilled in the art will recognize that the described parameters may be varied in accordance with the teachings of the invention. A suitable plasma generator and system for the cleaning step is the ENI ACG-3B RF Plasma Generator and Advanced Energy Industries AM5 Matching Network, though one skilled in the art will recognize that any suitable system and method for cleaning the deposition surface of the polyimide substrate may be used.

According to an illustrative embodiment, the polyimide substrate 32 is a flexible film having a thickness of between about 25 microns and about 100 microns, and preferably between about 45 and about 55 microns and most preferably about 51 microns, though one skilled in the art will recognize that the invention is not limited to the described thickness.

According to alternate embodiments, the substrate 32 may comprise plastic, PET, PEN, polyester, high temperature polymers or other suitable flexible material.

After cleaning, the passivation layers 34, 36 are deposited on the polyimide substrate 32 to provide isolation and passivation of the polyimide substrate. Passivation of the substrate provides a standardized substrate surface that is a barrier to moisture and solvent uptake by the polyimide substrate and provides adhesion to the subsequent thin-film transistor layers. Prior to deposition of the passivation layers, the deposition chamber is flushed. According to the illustrative embodiment, the first passivation layer 34, comprising $SiN_x$, is deposited on the top deposition surface, which will contain the thin-film transistors, using a mixture of $H_2$, $SiH_4$ and $NH_3$ at between about 100° Celsius and about 250° Celsius and preferably about 150° Celsius at a pressure between 0.2 to 0.8 Torr, preferably 0.5 Torr, and a rf power density between 0.07 to 0.3, preferably 0.067, watts per centimeter squared. According to the illustrative embodiment, the gases and flow rates for depositing the passivation layer are $SiH_4$ at about between 2 to 10 standard cubic centimeters/minute and preferably about 5 standard cubic centimeters/minute, $H_2$ at between about 100 to about 400 standard cubic centimeters/minute and preferably about 220 standard cubic centimeters/minute, and $NH_3$ at about between 20 to 80 standard cubic centimeters/minute and preferably about 50 standard cubic centimeters/minute. The second passivation layer 36, also comprising $SiN_x$, is deposited on the bottom side of the polyimide substrate 32 in a similar process to isolate and passivate the substrate.

Figure 7:
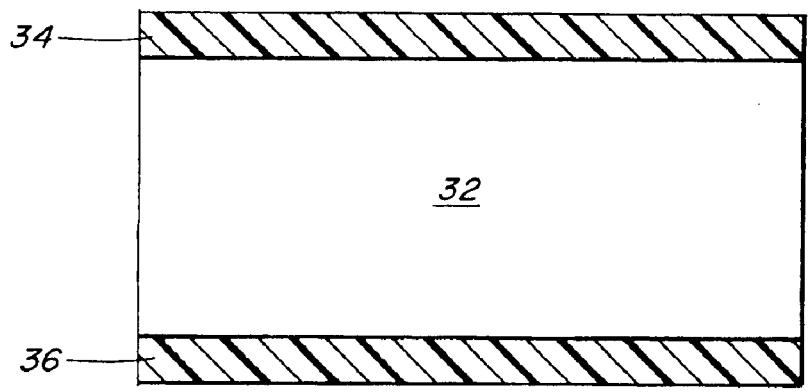
FIG. 7 illustrates the sample after coating of the substrate with the passivation layers.

FIG. 7 is a cross-sectional view of a single pixel of the backplane sample 20 at this stage of the fabrication process. According to the illustrative embodiment, the passivation layers 34, 36 have a thickness of between about 250 nanometers and about 1000 nanometers, and preferably about 500 nanometers. One skilled in the art will recognize that the invention is not limited to the described range and that the passivation layers may have any suitable thickness.

After passivation, the gate electrodes 42, lines 43 and pads are fabricated on the coated substrate using e-beam evaporation and photolithography. According to the illustrative embodiment, the gate material forming the gate electrode layer 40 comprises a first gate material, preferably aluminum, deposited on the passivation layer and an overcoat gate material, preferably chromium, deposited over the first gate material. According to the illustrative embodiment, the first gate material has a thickness of between about 500 and about 5000 Angstroms and preferably about 1000 Angstroms. The second gate material preferably has a thickness of between about 50 and about 200 Angstroms and more preferably about 100 Angstroms. The first gate material and overcoat gate material are deposited on the top surface of the first passivation layer 34 under high vacuum using an e-bean evaporator, such as the Ebeam Evaporator from Denton Vacuum, to form a thin film 40 of the gate material over the first passivation layer 34. Other techniques for thin-film metallization can be used in accordance with the present invention.

Figure 8:
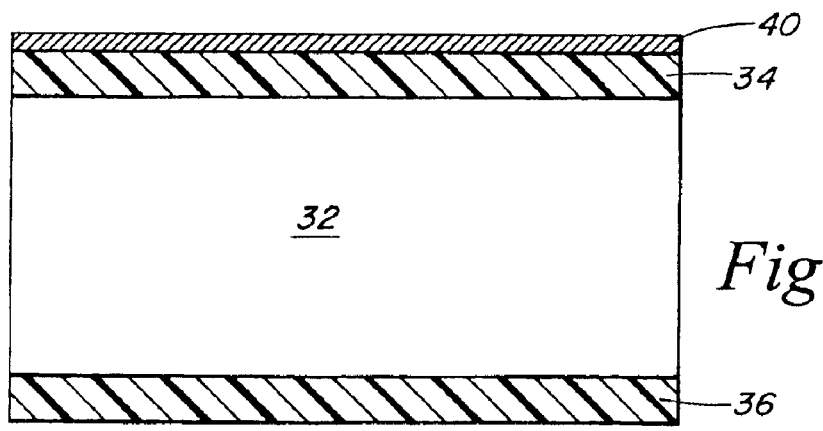
FIG. 8 illustrates the sample in a single pixel region after deposition of the gate material.

FIG. 8 is a cross-sectional view of the sample after deposition of the gate material. According to the illustrative embodiment, the gate material 40 has a thickness of between about 50 nanometers and about 500 nanometers, and preferably about 100 namometers. One skilled in the art will recognize that the invention is not limited to the described range and that the layer of gate material may have any suitable thickness.

Figure 9:
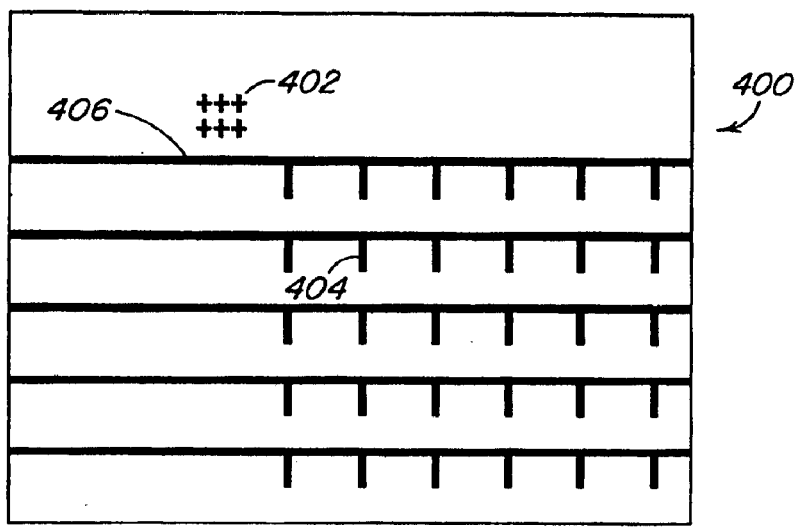
FIG. 9 is a detailed view of a portion of a first mask used to fabricate the gate electrodes of the thin film transistor array backplane of the present invention.

After metal deposition, the gate electrodes 42, lines 43 and pads are patterned with a gate mask 400, illustrated in FIG. 9, using photolithography. The gate mask 400 shown in FIG. 9 illustrates the first 5×6 pixels in the array. The mask includes alignment marks 402 to assist in precisely aligning the mask 400 on the substrate and features 404 and 406 defining the gate electrodes and lines, respectively. The mask 400 is aligned with the coated substrate, so that the pattern on the mask can be transferred onto the surface of the first passivation layer 34. The top surface is first spin coated with an adhesive promoter, such as hexamethyldisilane (HMDS), followed by application of a photoresist, such as AZ5214$^2$ photoresist commercially available from Clariant Corporation of Somerville, N.J., and spin coating to produce a thin uniform layer of photoresist. According to the illustrative embodiment, the sample is spin coated at about 4000 revolutions per minute for about forty seconds, though other suitable rates and times may be used. After spin coating, the sample is soft-baked in an oven to remove substantially all of the solvents from the photoresist coating. According to the illustrative embodiment, the sample is soft-baked in an oven at about 90° Celsius for about twenty minutes, though other temperatures and times may be used. According to one embodiment the exposure time for developing the electrodes may be about 50 to about 100 seconds and preferably 71.5 seconds at about 0.5 to about 3.0 milliwatts per centimeter, preferably 2.0 milliwatts per centimeter squared at a pressure of about 2 mBar pressure using a 1:1 AZ312 developer. The chromium overcoat layer is then etched for about 40 seconds by treating the chromium with a Ce$^{+4}$ based etchant solution, such as the CR-7 Chromium Photomask Etchant solution from Cyantek Corporation, following by washing the sample with deionized water and hard-baking the sample. According to an illustrative embodiment, the sample is hard baked at about 115° C. for about twenty minutes. The remaining unwanted aluminum in the first gate layer is removed using a suitable solution, such as, but not limited to, a solution comprising a mixture of 5% phosphoric acid, 5% deionized water, 5% acetic acid and 5% nitric acid. The photoresist layer may be removed using acetone in an ultrasonic cleaning bath or through other suitable means known in the art.

Figure 10A:
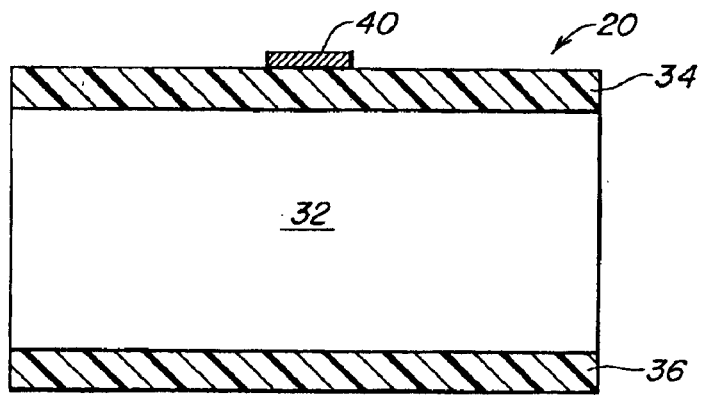
FIGS. 10a and 10b illustrate the sample in a single pixel region after patterning of the gate electrode and line.
Figure 10B:
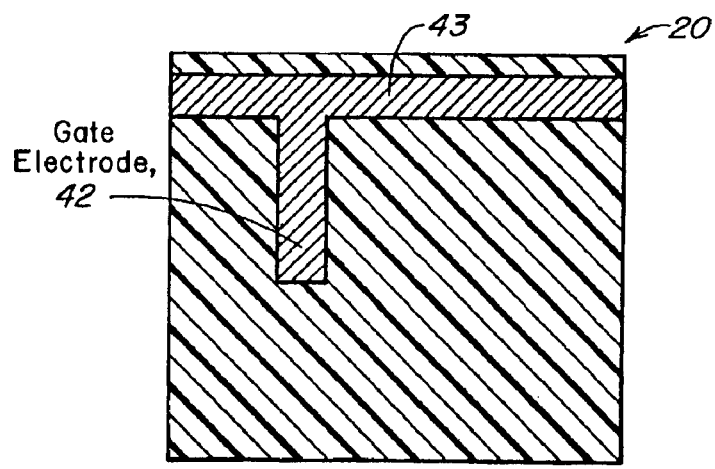

FIG. 10A is a cross-sectional view of the sample and FIG. 10B is a top view of the backplane sample 20 in a single pixel area after patterning of the gate electrodes 42 and lines 43 using the first mask 400.

According to an alternate embodiment, the first gate layer of the gate electrode 40 comprises titanium, rather than aluminum. One skilled in the art will recognize that other metals may be used to form the gate electrodes and that the invention is not limited to aluminum or titanium.

After patterning of the gate electrodes 42 and 44 in the gate layer 40, the patterned substrate is placed in the PECVD deposition chamber to deposit the gate insulation layer 44 over the patterned gate layer 40 using plasma enhanced chemical vapor deposition. After a cleaning step, preferably using argon plasma, the gate insulation layer 44 may be deposited in a manner similar to the process for depositing the passivation layers 34, 36, as described above, using a gas mixture of hydrogen, $SiH_4$, and $NH_3$. According to one embodiment, the gate insulation layer is deposited at a temperature of between about 100° Celsius and about 250° Celsius and preferably about 150° Celsius, a pressure of between about 0.1 and about 1.0 Torr and preferably 0.5 Torr, and an rf power density of between about 0.01 and about 10.0 and preferably about 0.067 watts per centimeter squared. According to an illustrative embodiment, the argon plasma treatment step is 2 minutes at between 0.07 to 0.3, and preferably 0.022, watts per centimeter squared. According to the illustrative embodiment, the gases and flow rates for depositing the insulation layer are $SiH_4$ at about between 2 to 10 standard cubic centimeters/minute and preferably about 5 standard cubic centimeters/minute, $H_2$ at about between 100 to 400 standard cubic centimeters/minute and preferably about 220 standard cubic centimeters/minute, and $NH_3$ at about between 20 to 80 standard cubic centimeters/minute and preferably about 50 standard cubic centimeters/minute.

Figure 11:
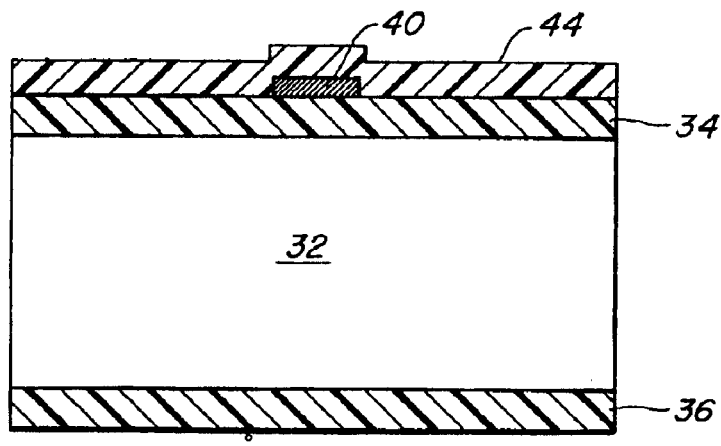
FIG. 11 is a cross sectional view of the sample in a single pixel area after deposition of the gate insulating layer

FIG. 11 is a cross sectional view of the sample 20 in a single pixel area after deposition of the gate insulating layer 44. According to an illustrative embodiment, the gate insulating layer 44 is between about 150 and about 700 nanometers thick and preferably about 360 nanometers thick. One skilled in the art will recognize that the invention is not limited to the described range and that the gate insulating layer may have any suitable thickness.

The sample may then be transferred to another chamber to deposit the channel layer or layers 50. To fabricate the channel layers, a mixture of $SiH_4$ and $H_2$ are used to deposit a layer of amorphous silicon (a-Si:H) over the gate insulating layer 44. According to the illustrative embodiment, the layer is about 2000 angstroms thick, though the invention is not limited to the described thickness. The amorphous silicon layer is deposited at a pressure of between about 0.1 to about 1.0 Torr and preferably 0.5 Torr, an rf power density of between about 0.01 and about 1.0 and preferably about 0.027 watts per centimeter squared and a temperature of between about 100° Celsius and about 250° Celsius and preferably about 150° Celsius for about 1900 seconds in the illustrative embodiment, though other parameters may be used. According to the illustrative embodiment, the gases and flow rates for depositing the channel layer are $SiH_4$ at between about 10 to about 40 standard cubic centimeters/minute and preferably about 20 standard cubic centimeters/minute and $H_2$ at between about 10 to about 40 standard cubic centimeters/minute and preferably about 20 standard cubic centimeters/minute.

According to an alternate embodiment, the channel layer 50 may comprise p-Si:H or other suitable material.

Figure 12:
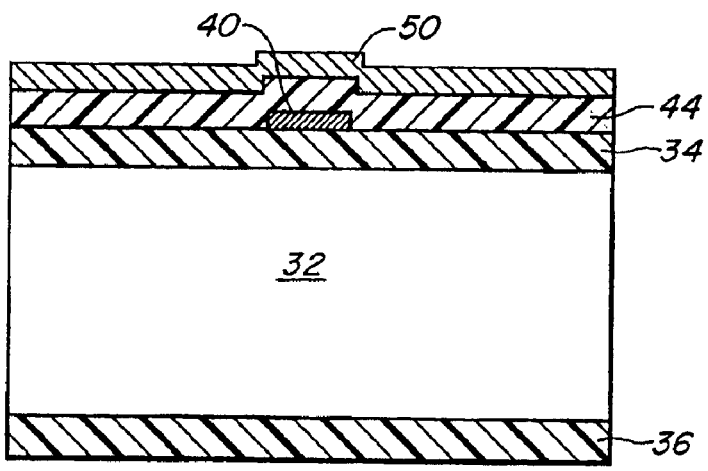
FIG. 12 is a cross sectional view of the sample in a single pixel area after deposition of the channel layer.

FIG. 12 is a cross sectional view of a single pixel of the sample 20 after deposition of the channel layer 50. According to an illustrative embodiment, the channel layer 50 is between about 100 and about 400 nanometers thick and preferably about 200 nanometers thick. One skilled in the art will recognize that the invention is not limited to the described range and that the channel layer may have any suitable thickness.

Figure 13:
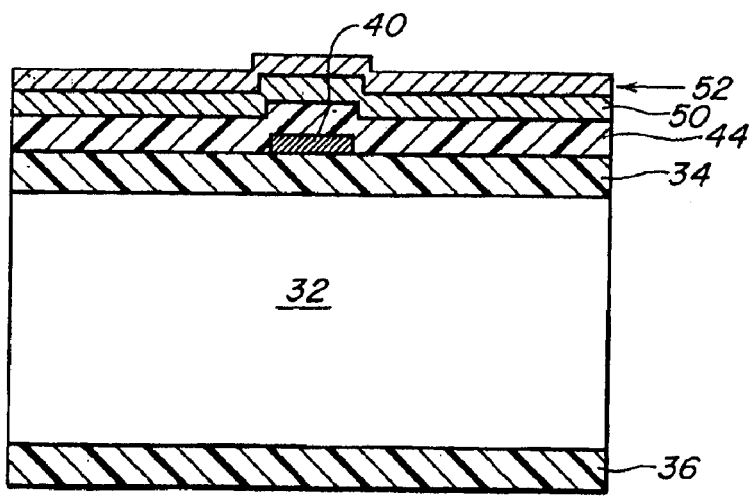
FIG. 13 is a cross sectional view of the sample in a single pixel area after deposition of the contact layer.

After deposition of the channel layer 50, the sample is transferred to another chamber to deposit the contact layer 52. According to the illustrative embodiment the chamber is first pumped out and the contact layer, comprising phosphorus doped amorphous silicon, is deposited at a pressure of about 0.1 to 1.0 Torr and preferably 0.5 Torr for about 400 seconds using a rf power density of between about 0.07 and about 0.3, and preferably 0.018, watts per centimeter squared. FIG. 13 is a cross-sectional view of the sample after deposition of the contact layer 52. The contact layer may have a thickness of between about 25 nanometers and about 100 nanometers. According to the illustrative embodiment, the contact layer 52 is a film of about 50 nanometers thickness. According to the illustrative embodiment, the gases and flow rates for depositing the contact layer are $SiH_4$ at about 44 sscm and about $PH_3$ at about 6 sscm.

Figure 14:
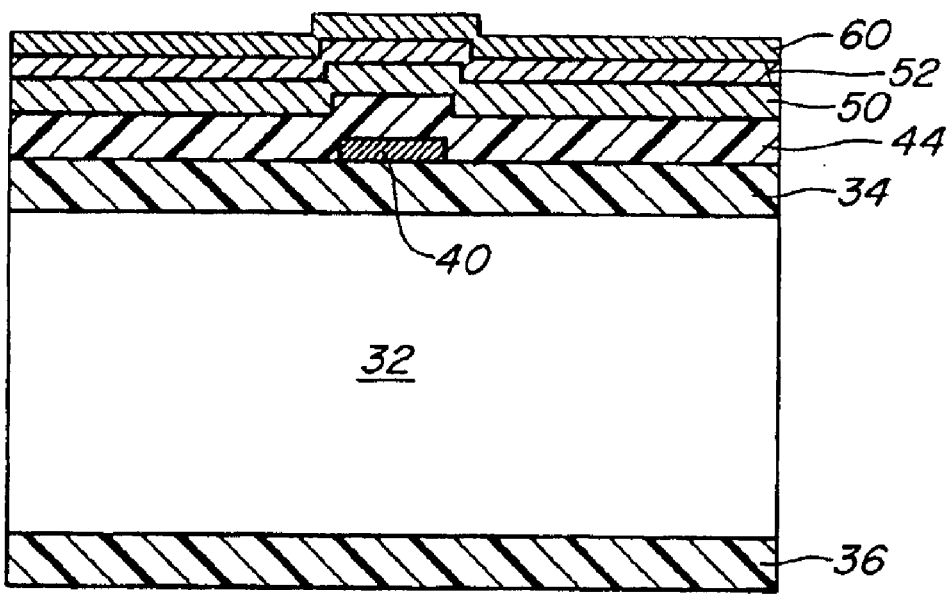
FIG. 14 is a cross sectional view of the sample in a single pixel area after deposition of the source-drain layer.

After deposition of the channel and contact layers, an array of source and drain electrodes are fabricated on the sample. The source and drain electrodes, lines and pads are fabricated by depositing a layer of metal 60, such as aluminum, over the contact layer 52 using the e-beam evaporator under high vacuum. FIG. 14 is a cross-sectional view of the sample after deposition of the source-drain metal. According to the illustrative embodiment, the source-drain layer has a thickness of between about 50 nanometers and about 200 nanometers and preferably about 100 nanometers.

According to an alternate embodiment, the material forming the source-drain layer 60 comprises a bi-layer of aluminum and chromium. Alternatively the source-drain layer 60 may comprise a tri-layer comprising a first layer of chromium, an intermediate layer of aluminum and a top layer of chromium.

Figure 15A:
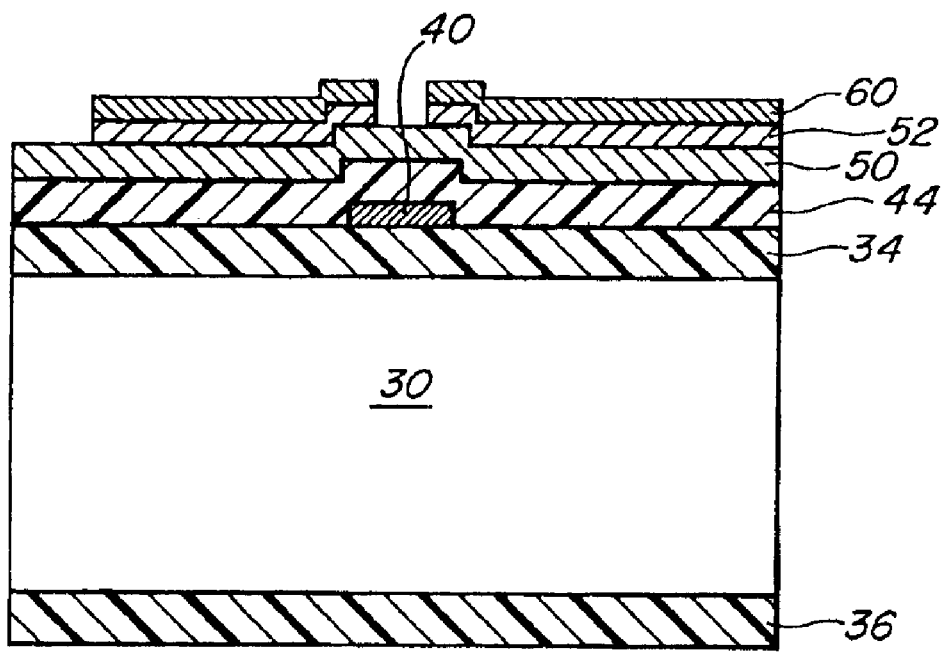
FIGS. 15a and 15b illustrate the sample after patterning the source and drain electrodes.
Figure 15B:
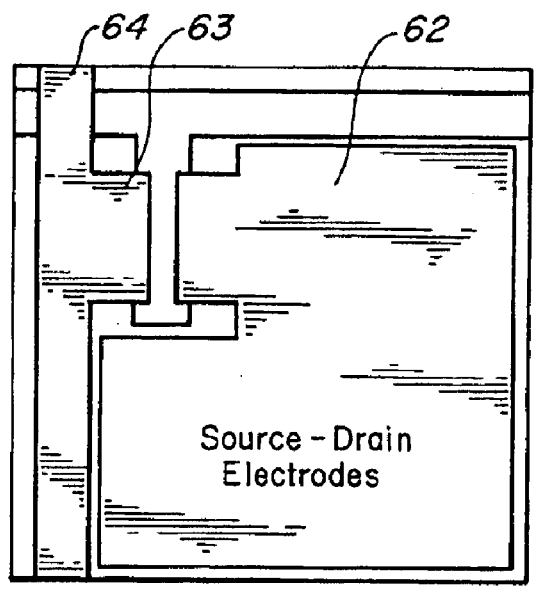
Figure 16:
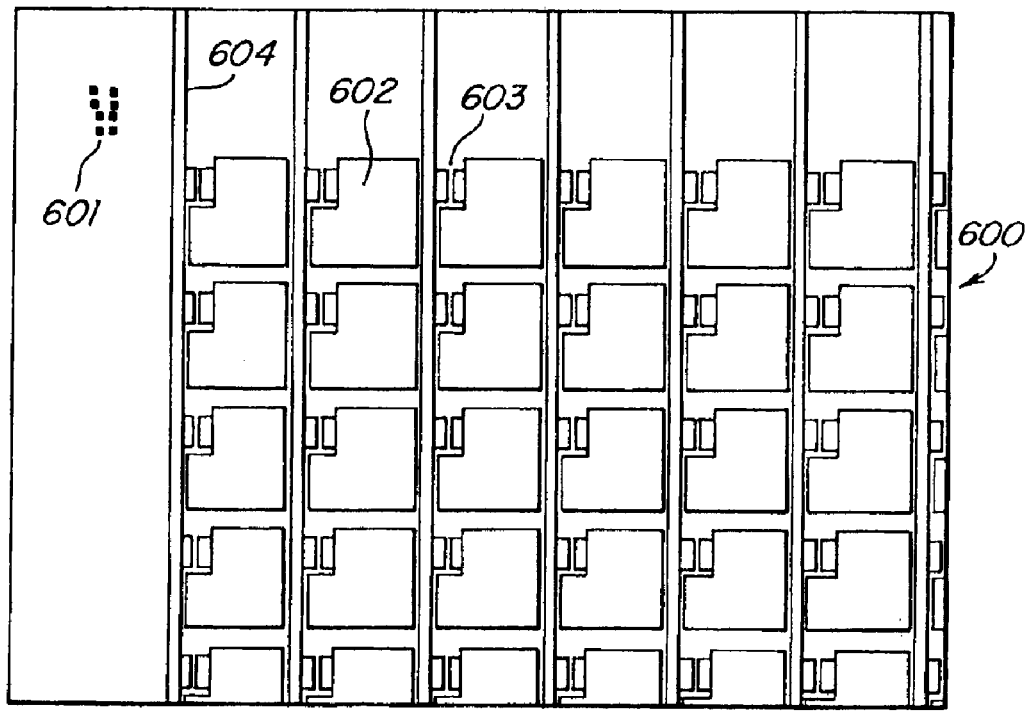
FIG. 16 is a detailed view of a portion of a second mask used to pattern the source and drain electrodes, lines and pads in the thin film transistor array backplane of the present invention.

After metal deposition, the structures are patterned using photolithography. FIGS. 15a and 15b illustrate the sample after patterning the source-drain electrodes. A portion of a source and drain electrode mask 600 for patterning the array of source and drain electrodes, lines and pads is illustrated in FIG. 16. As show, the mask 600 includes alignment marks 601 for aligning the mask on the substrate. The mask also includes source electrode patterns 603, drain electrode patterns 602, line patterns 604 and pad patterns for each pixel in the array.

To fabricate the source-drain layer 60, the top surface is first spin coated with an adhesive promoter, such as HMDS, followed by photoresist spin coating at 4000 rpm for 40 seconds, preferably using AZ5214 photoresist. Then, the sample is soft-baked in an oven, for example, at about 90° C. for about twenty minutes, followed by patterning of the source-drain structure. The source-drain structure may be patterned using a contact aligner, such as the Karl Suss MA6 Aligner. According to the illustrative embodiment, a suitable exposure time is about 50 to 100 seconds, preferably 71.5 seconds and a suitable light fluence is about 0.5 to 3.0 milliwatts per centimeter, preferably 2.0 milliwatts per centimeter. The source-drain electrodes 62, 63 may be developed for about sixty seconds in a 1:1 AZ312 developer, rinsed in deionized water and then baked at about 115° C. for about twenty minutes. The unwanted source-drain material (i.e., the aluminum and/or chromium) in the source/drain layer 60 is removed. According to one embodiment the unwanted aluminum material is removed with a mixture of about 85% phosphoric acid, 5% deionized water, 5% acetic acid and 5% nitric acid. The sample may then be washed, for example, using deionized water, and subsequently hard-baked at 115° C. for about twenty minutes. The phosphorus-doped layer may be etched using a plasma etcher, such as the Plasma-Therm 790 System. Suitable etching conditions are about 150 mbar, 16 standard cubic centimeters per minute (sccm) of $CF_4$ and 0.12 watts per centimeter squared for a total of about seven minutes, though other suitable parameters may also be used. The second mask photoresist layer maybe removed using any suitable means, such as acetone in an ultrasonic cleaning bath.

Figure 17:
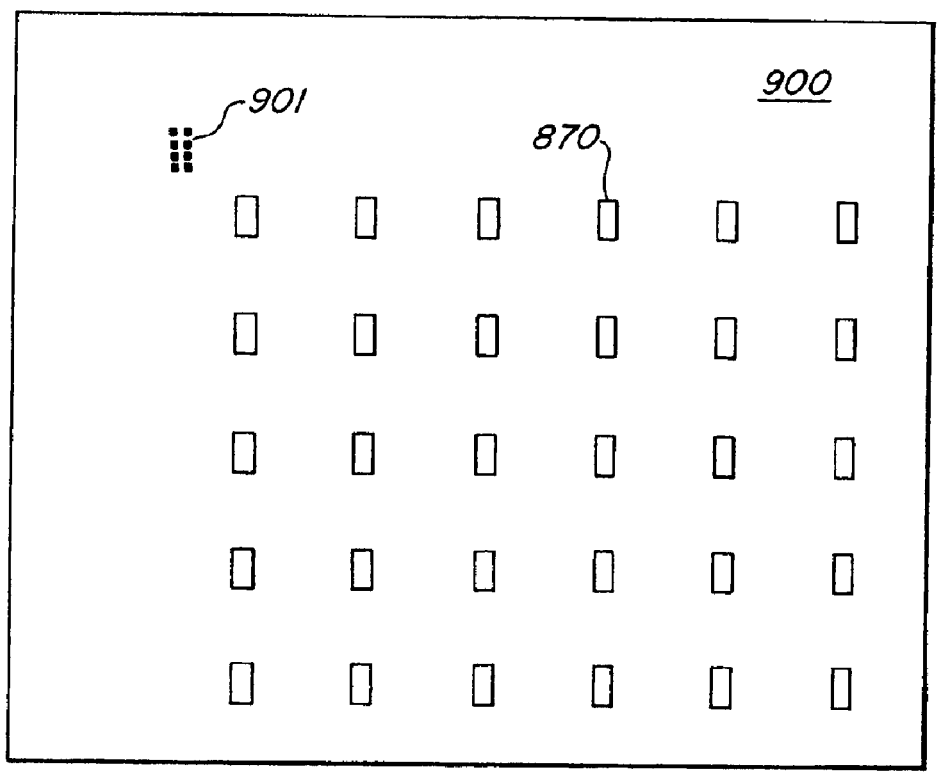
FIG. 17 is a detailed view of a portion of a third mask used to pattern the transistor islands in the thin film transistor array backplane of the present invention

After fabrication of the source and drain electrodes, an array of transistor islands 57 are patterned using photolithography. A portion of the transistor island mask 900 is shown in FIG. 17. As shown, the transistor island mask 900 includes alignment marks 901 and an array of transistor island features 870. To pattern the transistor islands, the top surface is first spin coated with an adhesive promoter, such as HMDS, followed by AZ5214 photoresist and spin coating. In one example, the sample is spin coated at about 4000 rpm for about 40 seconds. The sample may then be soft-baked in an oven to remove substantially all of the solvents from the photoresist coating. According to one embodiment, the exposure time is about 50 to 100 seconds, preferably 71.5 seconds and the light fluence is about 0.5 to 3.0 milliwatts per centimeter, preferably 2.0 milliwatts per centimeter. The array of transistor islands 57 may be developed for about sixty seconds using a developer, such as 1:1 AZ312 developer in deionized water. After development of the transistor islands 57, the sample is rinsed in deionized water and baked in an oven at about 115° C. for about twenty minutes. Then, the amorphous silicon channel layer 50 may be etched using a plasma etcher, such as the Plasma-Therm 790 System VII. Suitable etching conditions are known in the art. According to one embodiment, the etching conditions are 150 mbar, 16 standard cubic centimeters/minute $CF_4$ and 0.12 watts per centimeter squared until the amorphous silicon layer is removed. One skilled in the art will recognize that the etching conditions are not limited to the described range. The remaining transistor island mask photoresist layer may be removed through suitable means, such as by using acetone in an ultrasonic cleaning bath.

Figure 18A:
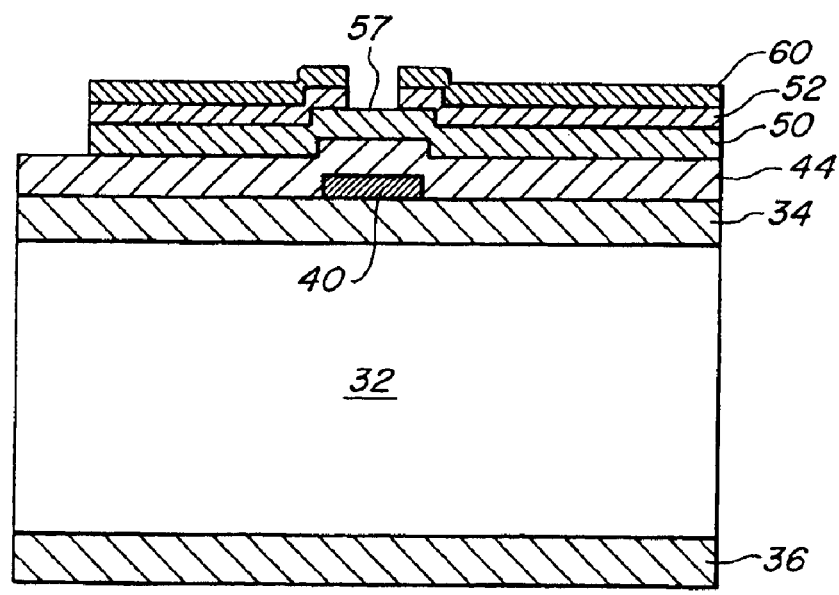
FIGS. 18a and 18b illustrate the sample after patterning of the transistor islands.
Figure 18B:
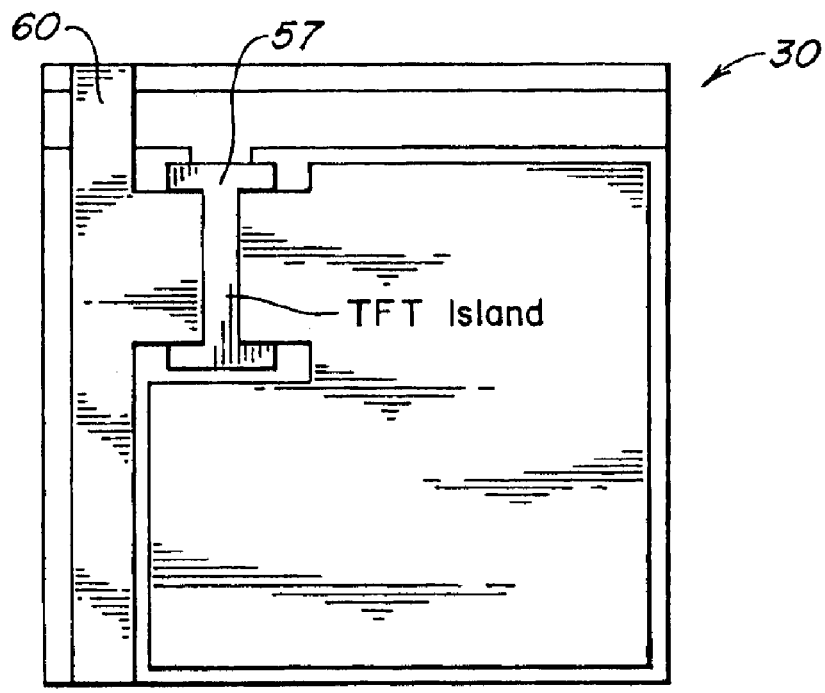

FIGS. 18a and 18b are cross-sectional and overhead views, respectively, of the sample 20 after patterning of the transistor islands 57 out of the channel layer material 50 as described above.

Figure 19:
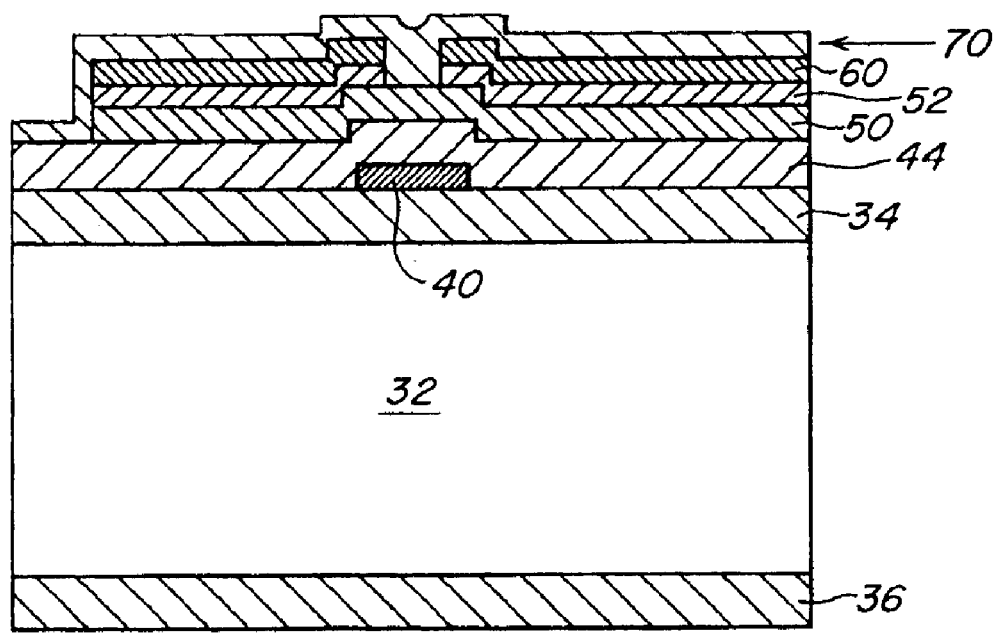
FIG. 19 is across sectional view of the sample in a single pixel area after deposition of the protective layer.

Finally, the protective layer 70 is deposited to complete the thin film transistor backplane. FIG. 19 is a cross-sectional view of the sample after deposition of the protective layer 70. According to the illustrative embodiment the protective layer comprises a layer of $SiN_x$ that is between about 130 and about 500 nanometers thick, and preferably about 260 nanometers thick, though one skilled in the art will recognize that the invention is not limited to the described thickness. The protective layer 70 may be deposited using plasma enhanced chemical vapor deposition, as described above, using a mixture of $H_2$, $SiH_4$ and $NH_3$ at a temperature of between about 100° Celsius and about 250° Celsius and preferably about 150° Celsius and a pressure of about 0.1 to 1.0 Torr and preferably 0.5 Torr at between about 0.01 and about 1.0 and preferably about 0.067 watts per centimeter squared. According to the illustrative embodiment, the gases and flow rates for depositing the protective layer are $SiH_4$ at ab out between 2 to 10 standard cubic centimeters/minute and preferably about 5 standard cubic centimeters/minute, $H_2$ at about between 100 to 400 standard cubic centimeters/minute and preferably about 220 standard cubic centimeters/minute, and $NH_3$ at about between 20 to 80 standard cubic centimeters/minute and preferably about 50 standard cubic centimeters/minute.

Figure 20:
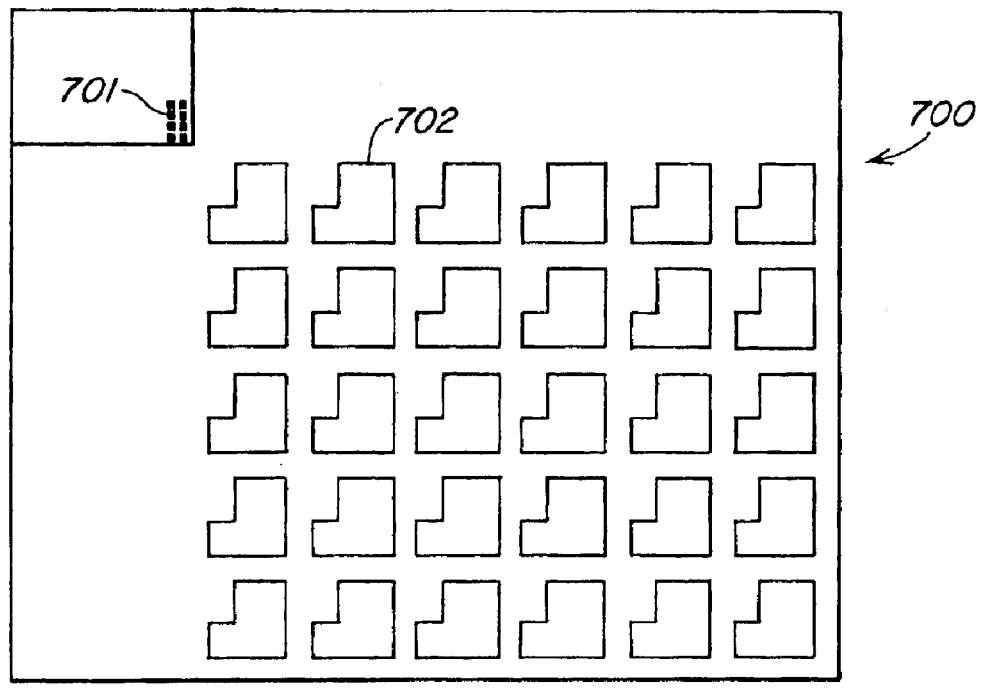
FIG. 20 is a detailed view of a portion of a fourth mask used in a final lithography step to fabricate the thin film transistor array backplane of the present invention.
Figure 21:
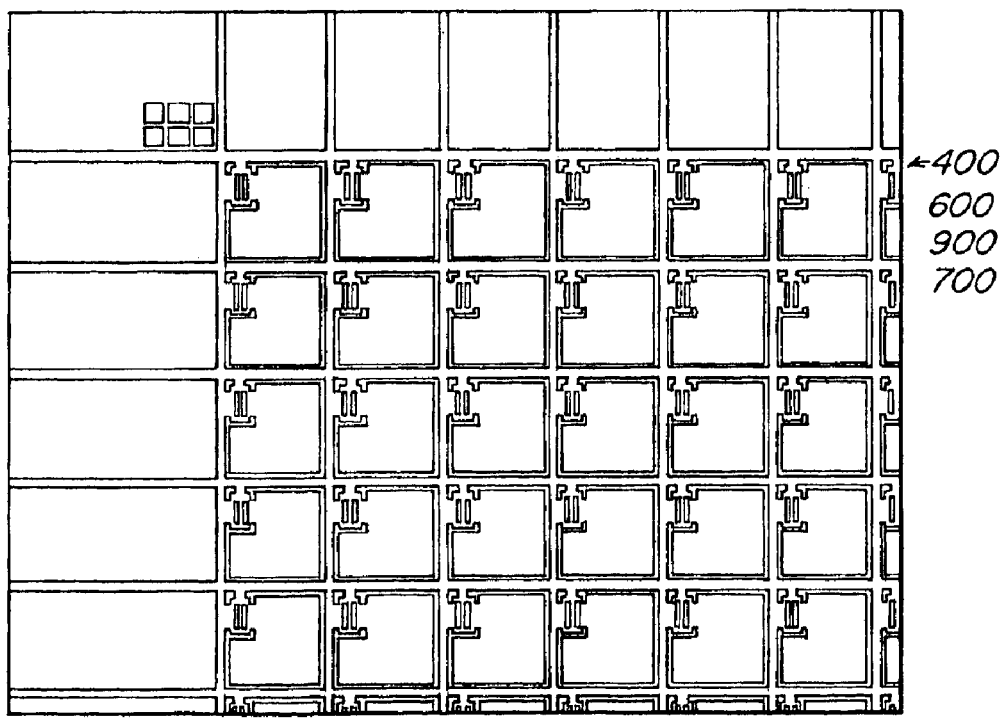
FIG. 21 is a detailed overlay of the first, second, third and fourth masks.

After deposition, the protective layer is etched to remove unwanted material over the drain pads 84 of the thin-film transistor 30 to expose the active pixel areas, thus forming the final structure shown in FIG. 5. The top surface is spin coated with an adhesive promoter, such as HMDS, followed by application of a photoresist layer, such as AZ5214 and spin coating at about 4000 revolutions per minute for about forty seconds. The sample may then be soft-baked in an oven at about 90° C. for about twenty minutes. A final lithography step may be patterned using a contact aligner, such as the Karl Suss MA6 Aligner using a fourth mask 700, shown in FIG. 20, with an exposure time of about 50 to 100 seconds, preferably 71.5 seconds and a light fluence of about one to about three and preferably about two milliwatts per centimeter squared. As shown, the mask 700 includes alignment marks 701 and an array of drain pad features 701. The gate insulator layer 44 and the top protective layer 70 are removed to expose the drain electrodes, gate pads and source pads using reactive ion etching (RIE). According to an illustrative embodiment, the drain electrodes, gate pads and source pads are exposed using a Plasma-Therm 790 System VII at 100 mbar, 35 standard cubic centimeters/minute of $CF_4$, 5 standard cubic centimeters/minute of $O_2$ and 0.16 watts per centimeter squared for about 8 minutes. The remaining photoresist of the fourth mask 700 may be removed using acetone in an ultrasonic cleaning bath or other suitable means.

Figure 22:
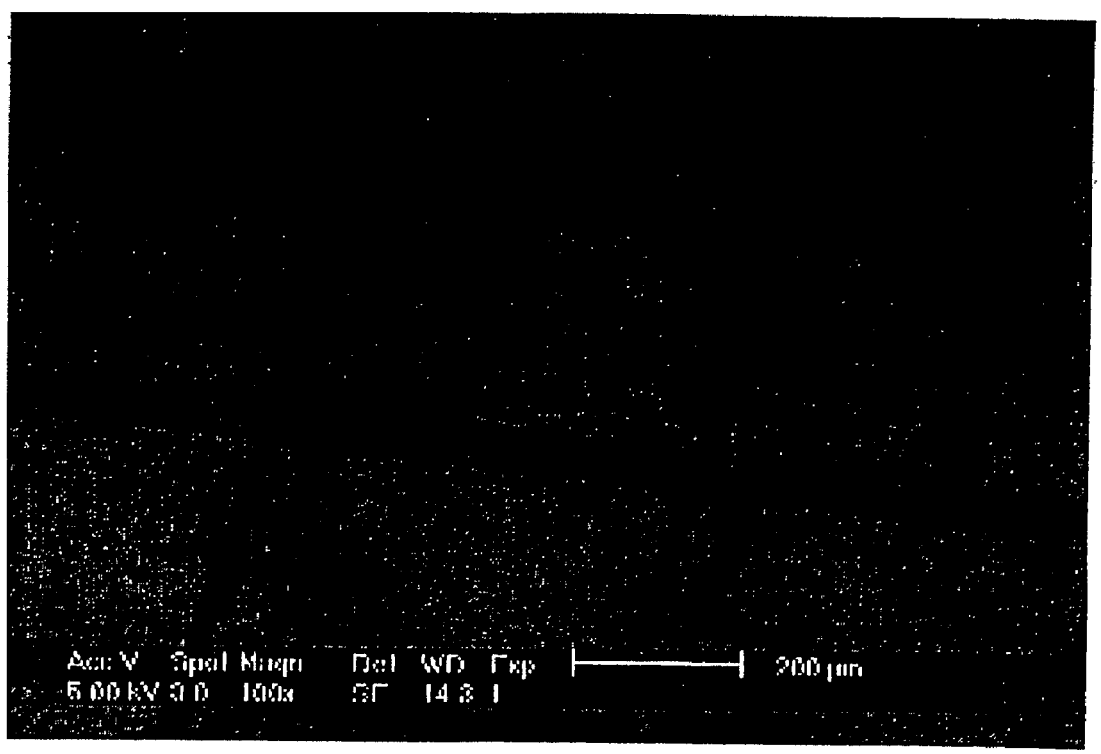
FIG. 22 is a SEM showing the source rain electrodes of a backplane of an illustrative embodiment of the present invention.

FIG. 22 illustrates a SEM of source and drain electrodes in a backplane fabricated according to an illustrative embodiment of the invention.

The transistor backplane 20 may be annealed in a forming gas, such as a mixture of $H_2$ in $N_2$ gas, at elevated temperatures. According to the illustrative embodiment, a suitable mixture is 15% $H_2$ in $N_2$ for about 1 hour at about 195° C.

Figure 23:
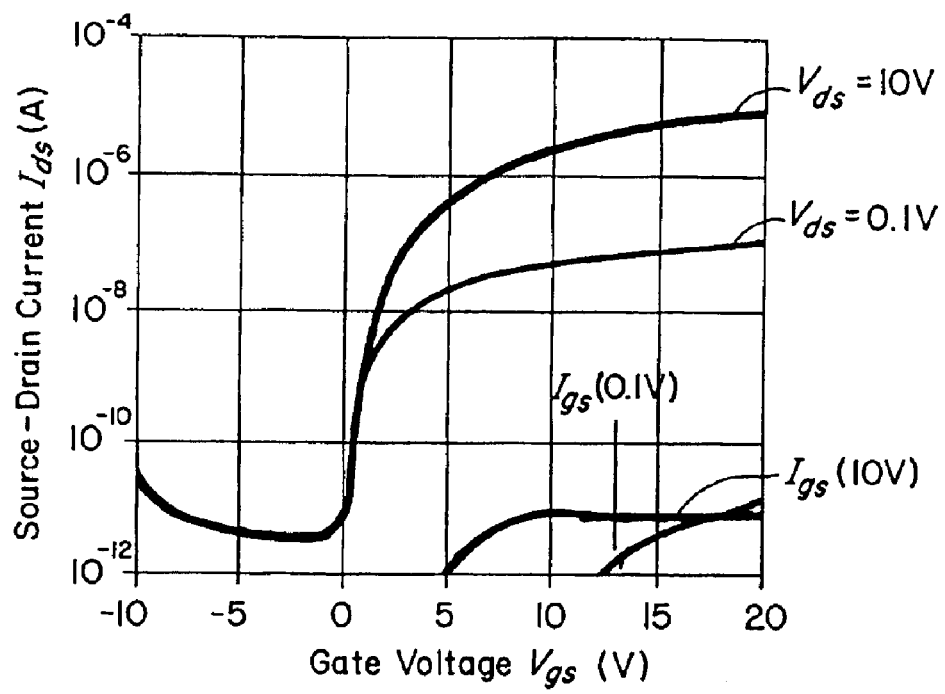
FIG. 23 is a graph of a source-drain current as a function of a gate voltage in a thin film transistor array backplane of the present invention.
Figure 24:
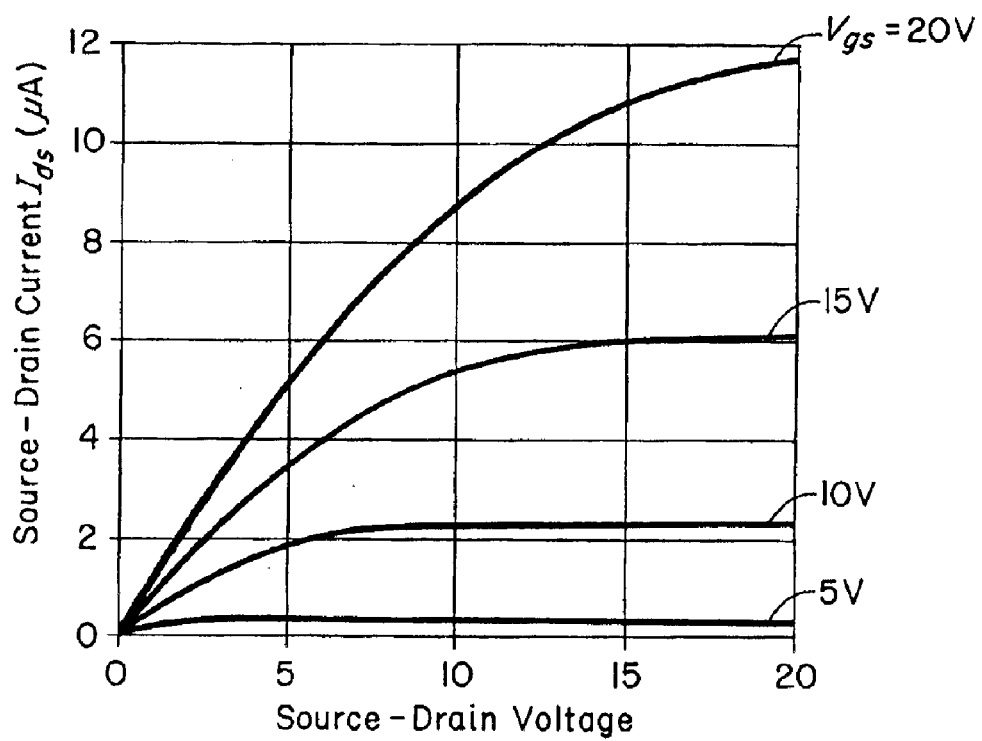
FIG. 24 is a graph of a source-drain current as a function of a source-drain voltage in a thin film transistor array backplane of the present invention.

The electrical characteristics of the transistor backplane 30 may be measured using a semiconductor analyzer during fabrication. FIGS. 23 and 24 illustrate the typical characteristics of the sample after patterning of the transistor islands. FIG. 22 illustrates a source-drain current as a function of a gate voltage in the thin film transistor array backplane 30 of the present invention, measured with drain voltages of 0.1 and 10 volts. The device is suitable for high-resolution displays with an ON/OFF ration of about $10^6$ when the gate voltage varies between 0 and 20 volts. FIG. 23 is a graph of a source-drain current as a function of a source-drain voltage in a thin film transistor array backplane of the present invention.

Figure 25:
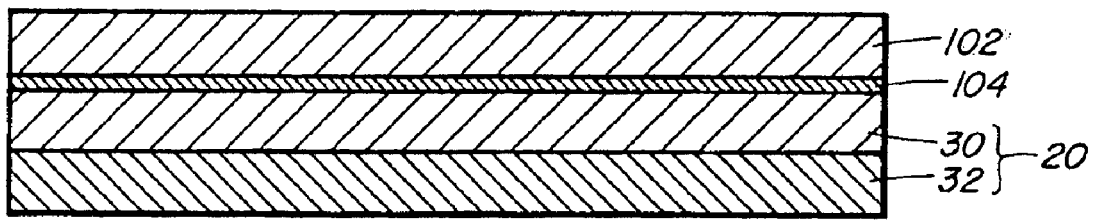
FIG. 25 is a schematic cross section of a pixel area of a flexible display including a thin film transistor array backplane of the present invention.

The fabricated array 20 of thin-film transistors 30 may be used as a flexible display by laminating, attaching or mounting a display medium to the backplane 20. According to one embodiment, shown in FIG. 25, a polymer dispersed liquid crystal (PDLC) display 100 may be fabricated by curing a 20:80 mixture 104 of prepolymer PN393 and TL213, both available from EM Industries) between the active matrix thin-film transistor array 20 and a sheet of ITO (indium tin oxide) coated polyester 102, from ISF Innovative Specialty Films, using a light source of about 3.0 milliwatts per centimeter squared and an exposure time of about twenty minutes. Two glass plates may be used to sandwich the composite during curing. Fiber spacers may be used to control the spacing between the drain pad and the ITO layer 102.

FIGS. 26–30 illustrate applications of the flexible backplane in display assemblies, which are no longer bound by the limitations of flat glass or a flat backplane. One skilled in the art will recognize that the displays can be wrapped or bent in more than one place.

Figure 26:
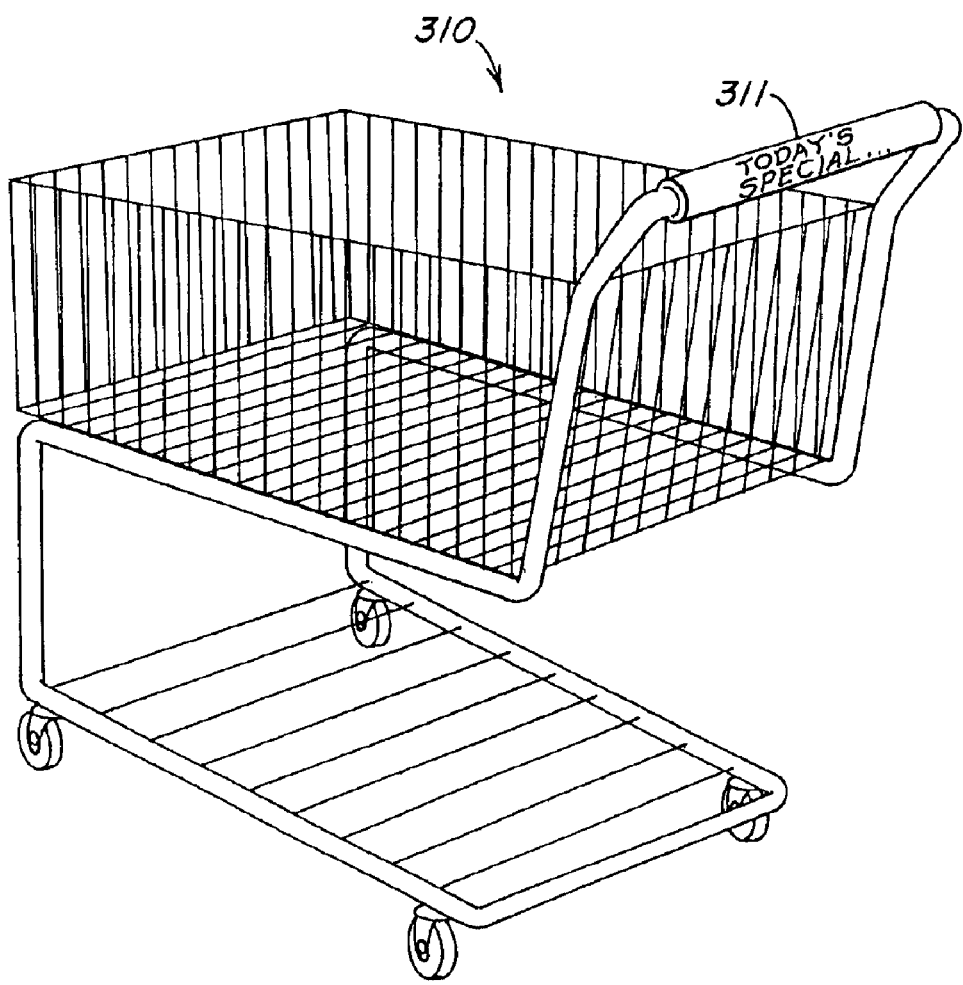
FIG. 26 illustrate a shopping cart implementing the flexible backplane of the present invention.

FIG. 26 illustrates an application of the flexible backplane of the invention in a round handle of a shopping cart 310. The flexible backplane forms a display 311 that can be used to inform shoppers of specials or provide information.

Figure 27:
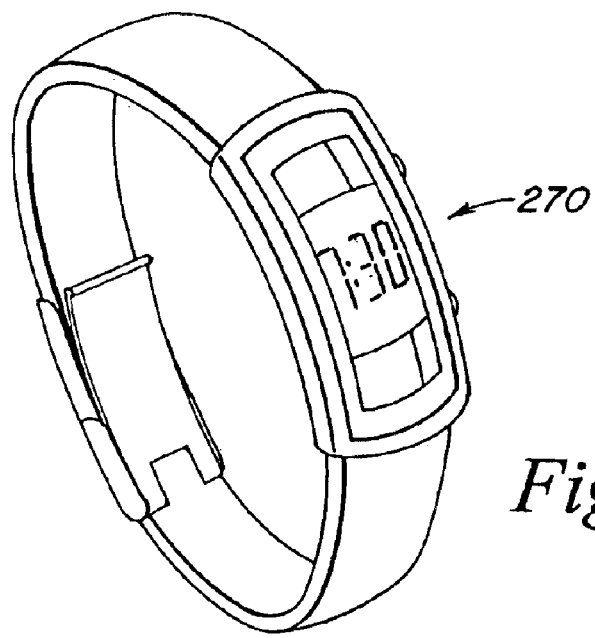
FIG. 27 illustrates a wristwatch implementing the flexible backplane of the present invention.

FIG. 27 illustrates a watch 270 where the face of the watch has the same convex shape in multiple dimensions as the band. The ability to have a convex display creates a smooth, contour shape. Other embodiments include ID wristbands, calculators or a display on any type of recording or playback device, radio, television, clock or home appliance with a retractable/roll-up display.

Figure 28:
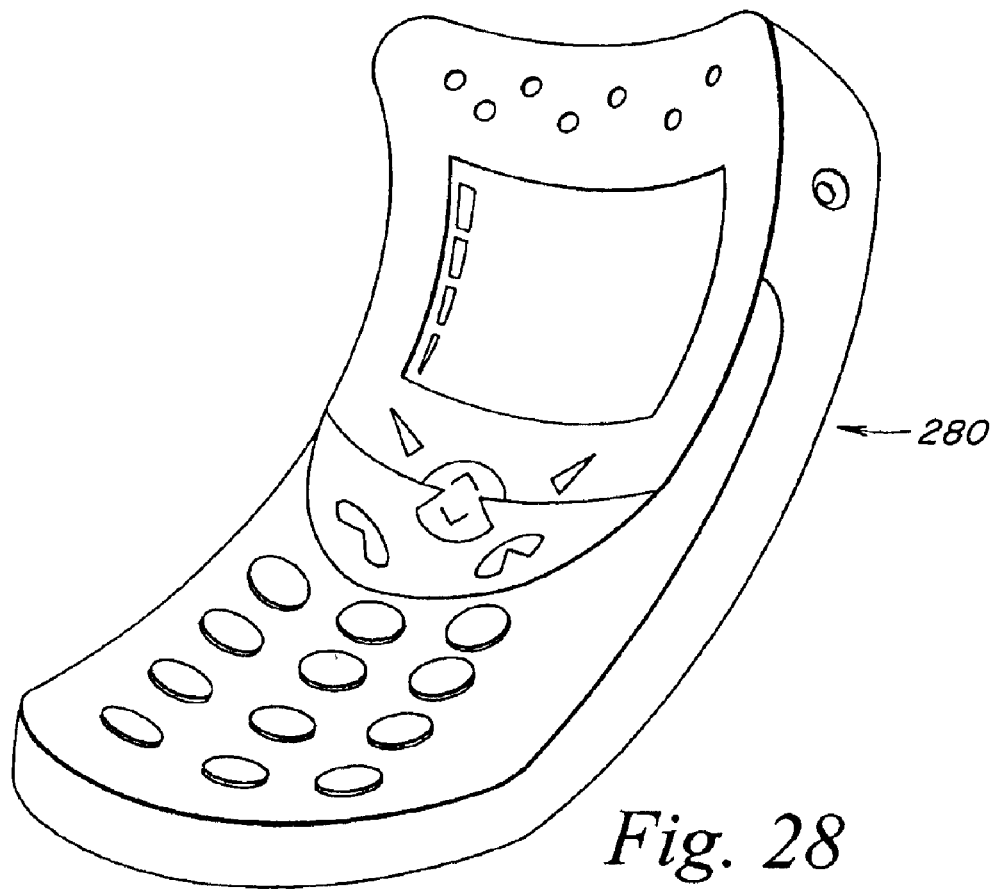
FIG. 28 illustrates a cell phone implementing the flexible backplane of the present invention.

FIG. 28 illustrates a cell phone 280 in which the display or imaging area is contoured so that the entire phone fits better against the listener's ear or in the user's hand or pocket. Other embodiments include calculators or a display on any type of recording or playback device, radio, television, clock, home appliance, electronic game set top boxes and so on.

Figure 29:
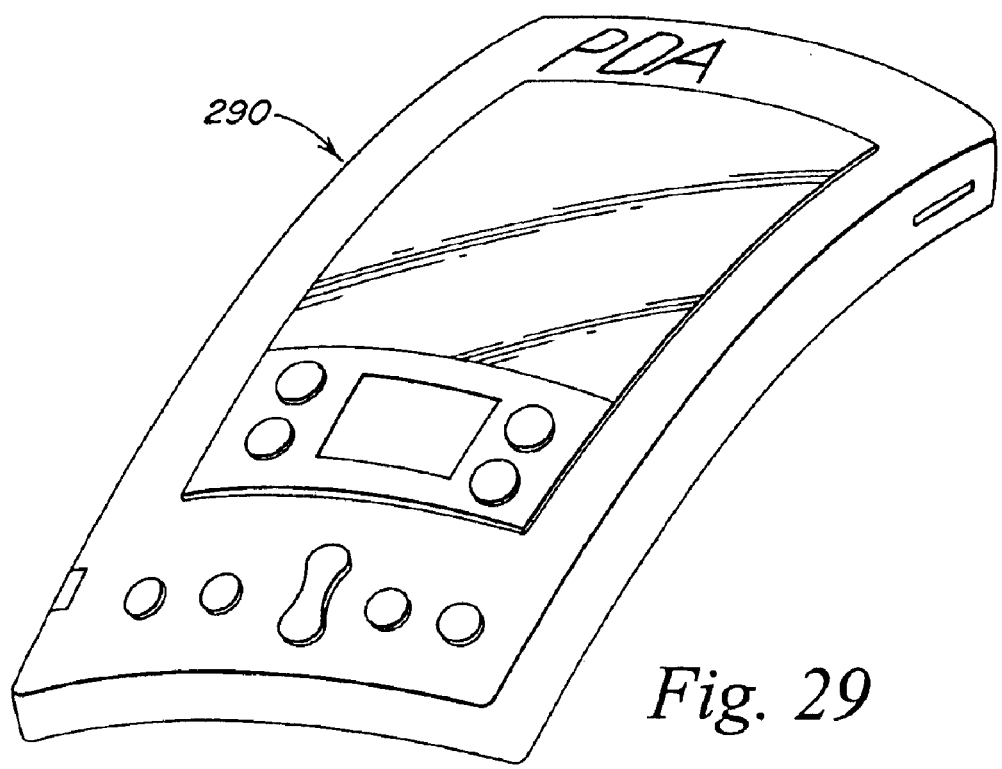
FIG. 29 illustrates a PDA implementing the flexible backplane of the present invention.

FIG. 29 illustrates a PDA 290 with a convex display that allows any information displayed to be more easily read.

Figure 30:
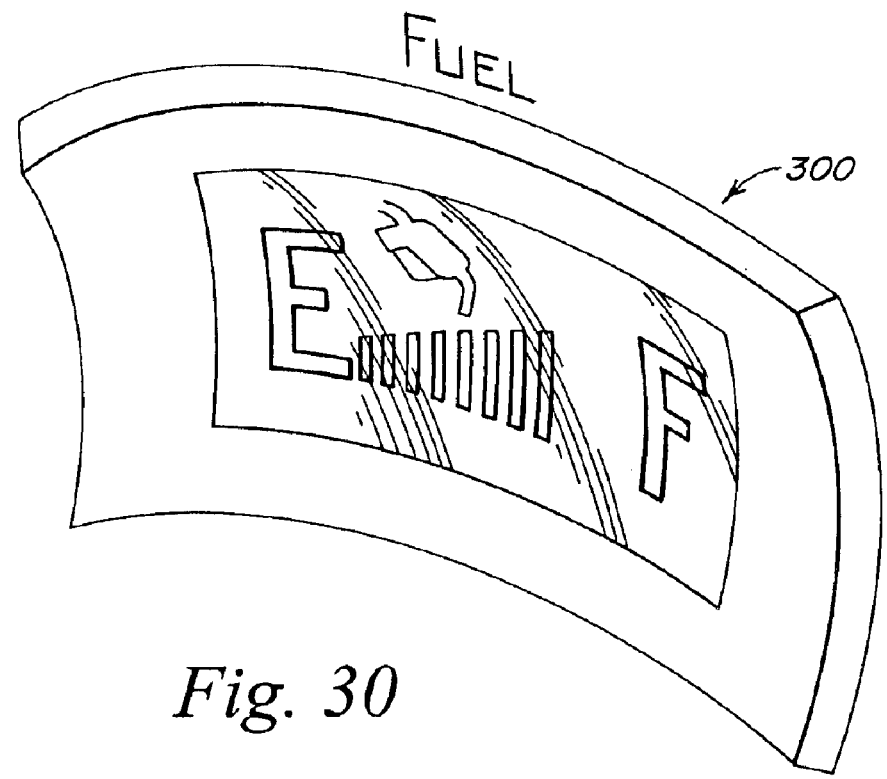
FIG. 30 illustrates a fuel gauge implementing the flexible backplane of the present invention.

FIG. 30 illustrates a fuel gauge 300 used in a car or truck. The flexible backplane enables the freedom to contour gauges into dashboard or panels in a safer design than flat displays and provides greater freedom in designing the interior of any type of vehicle. The flexible backplane may be implemented in any suitable type of gauge or instrument.

According to an illustrative embodiment, the display using the active matrix thin-film transistor array backplane of the invention possesses a resolution of about 51 dpi, with 3600 pixels on an active display area of about 3 centimeters squared. The display using the backplane of the invention may also be manufactured in sized of 8.5 by 14 inches or larger, to allow creation of electronic paper for writing, drawing, printing, copying or faxing. One skilled in the art will recognize that the invention is not limited to the described size, shape or dpi and that a backplane have varied parameters is embodied by the present invention.

The active matrix thin film transistor array backplane of the present invention and the described method of manufacturing the active matrix thin film transistor array backplane provide significant advantages over the prior art. The backplane is a compliant, flexible structure that is not damaged when bent, allowing a display formed using the backplane to be conformable to a variety of surfaces and items. The flexible substrate makes possible efficient manufacturing methods, such as roll to roll processing and photoresist-free fabrication techniques that can lower overall manufacturing costs. The backplane is lightweight and stronger than prior thin-film transistors formed on glass substrates. The backplane provides high-resolution displays that are easily controlled and updated. The backplane and displays using the backplanes of the invention are rugged, conformable, robust resistant to failure, lightweight and non-breakable. The backplane is resistant to strain and performs substantially the same under compressive strain and when lying flat. The device is also stable to elevated temperature and humidity. The backplane fabricated on polyimide according to the present invention performs substantially identically to backplanes formed on glass substrates, while reducing cost, and providing a more lightweight and robust product.

EXEMPLIFICATION OF THE INVENTION

EXAMPLE 1

Flexible active matrix matrix TFT array backplanes we re fabricated on 51 $\mu$m thick polyimide foil Kapton® E) substrates, as described in the article by C. E. Forbes, A.

Gelbman, C. Turner, H. Gleskova, and S. Wagner entitled "A Rugged Conformable Backplane Fabricated with an a-Si:H Array on a Polyimide Substrate," SID '02 Digest, 33, 2000 (2002). This article is incorporated herein by reference.

The substrate used for the flexible backplane was a three inch square of 51 μm thick Kapton® foil, which is available from DuPont Films. For comparison, Corning 1727 glass was used as the substrate for the rigid non-flexible backplane. In order to passivate the Kapton foil, both sides of the substrate were coated with 500 nm thick SiNx layers. In this deposition step, as well as subsequent steps, the film was processed as a free-standing substrate. The glass substrate was coated with SiNx (500 nm) on the device side only using the same recipe. PECVD, which the gasses SiH4, H2 and NH3 at 150° C., was used for the deposition. Recipes were optimized to minimize stresses in the substrate with the goal of achieving a flat and stress-balanced film after both SiNx depositions were complete. After the SiNx passivation steps, the glass and Kapton backplanes were processed identically.

At each pixel element, the TFTs have a bottom gate, back-channel etch structure. The gate structure was first fabricated by electron beam metal evaporation (110 nm). Photolithography and wet etching were then used to pattern the gate lines. PECVD (three chambers) was used for the second 360 nm layer of SiNx, followed by a 200 nm a-Si:H layer from SiH4, H2 and PH3. Deposition temperatures were 150° C. and recipes were optimized for Kapton substrates. The source and drain electrodes were made using photolithography with a 120 nm metallization layer. The channel length was 20 μm and width was 120 μm. Reactive ion etching (RIE) with photolithography was used to pattern the transistor islands. The final SiNx layer (230 nm) was patterned using photolithography and RIE to expose the active pixel areas.

The completed backplane of Kapton was nearly flat with only a minor outward curvature of radius ~18 cm. In comparison, untreated virgin Kapton had an inward radius of curvature of ~14 cm due to roll-to-roll processing by the manufacturer. The final curvature of the fabricated device is controlled by processing conditions that have been optimized for stress balance between the many layers of the device.

The TFT transfer characteristics $I_{ds}$, versus $V_{gs}$ for $V_{ds}$=0.1 and 10 V were measured for the Kapton and glass backplanes. For both devices, the off currents are in the low $10^{-12}$ range, and the on-off current ratio ~$10^7$. Nearly identical characteristics were observed for the Kapton and glass backplanes.

The TFT Kapton substrates were bent against a radius of curvature for a set time, followed by measurements of the TFT electrical properties. TFT characteristics were measured after the back (bottom) SiNx protective layer was removed in order to provide a compliant substrate. After this procedure, the radius of curvature of the backplane sample decreased from 18 cm to 9 cm. A test jig, constructed from 2-inch ID PVC pipe, was used to stress the sample for 20 minutes and allow measurement of the TFT characteristics while the sample was under inward compressive bending at a radius of 2.5 cm. The in situ measurement gave experimentally similar results to the unstressed sample. More severe bending experiments down to an inward radius of curvature of 1.6 cm, followed by random testing of the TFTs; indicated no catastrophic failure of the TFTs.

EXAMPLE 2

A 3 in.×3 in. piece of Kapton Polyimide from DuPont was carefully cleaned with DI water in a Branson 3510 Ultrasonic Bath prior to being placed in a multi-chamber S900 PECVD manufactured by System Innovative Systems Engineering. Under high vacuum, the sample was exposed to argon plasma (ENI ACG-3B RF Plasma Generator and Advanced Energy Industries AM5 Matching Network) for 2 minutes at a pressure of 0.5 Torr and 0.22 W/cm² at 200° C. in order to clean the deposition surface. After flushing the deposition chamber, a passivation SiNx layer (3600 angstroms) was deposited on the top surface using a mixture of H2, SiH4 and NH3 at 200° C. at 0.5 Torr and 0.067 W/cm². This process was repeated on the bottom side of the polyimide substrate.

The gate electrodes, lines and pads were made from a deposited bilayer of aluminum (1000 angstroms) and an overcoat of chromium (100 angstroms). These metals were deposited on the top surface of SiNx using a Denton E-beam Evaporator under high vacuum. After metal deposition, photolithography was used to pattern these structures. The top surface was first spin coated with HMDS, followed by AZS214 photoresist and spin coating at 4000 rpm for 40 seconds. The sample was then soft-baked at 90° C. for 20 minutes. The chromium layer was etched by treating with a $Ce^{+4}$ based CR-7 Chromium Photomask Etchant solution (Cyanteck Corp), washed with DI water, followed by a hard bake at 115° C. for 20 minutes. The remaining unwanted aluminum surface was removed with a mixture of 85 phosphoric acid: 5 m DI water: 5 ml acetic acid: 5 ml nitric acid. The photoresist layer was removed using acetone in an ultrasonic cleaning bath.

The coated substrate with patterned gate electrodes was then placed in the multi-chamber PECVD vacuum chamber and deposited with a SiNx 3600 angstrom layer with a gas mixture of H2, SiH4 and NH3 at 200° C. at 0.5 Torr and 0.067 W/cm² after a 2 minutes 0.022 W/cm² Ar plasma cleaning step. Without breaking the vacuum, the sample was transferred to another chamber used solely for the a-Si:H depositions. A 50:50 mixture of SiH4 and H2 at 0.5 Torr at 0.027 W/cm² at 200° C. for 1900 seconds was used to deposit a 2000 angstrom a-Si:H layer over the SiNx layer. The sampled was then moved to a chamber reserved for (n+)a-Si:H depositions, the reactor chamber was pumped out and the (n+)a-Si:H layer was deposited at a pressure of 0.5 Torr for 400 seconds using 0.018 W/cm², resulting in a film approximately 500 angstroms thick. The gasses and flow rates were SiH4 (44 sscm) and PH3 (6 sscm).

The source and drain electrodes, lines and pads were made from a deposited tri-layer of chromium-aluminum-chromium deposited over the top surface of (n+)a-Si:H using the Denton E-beam Evaporator under high vacuum. The first chromium layer was 100 angstroms, the aluminum layer was 1000 angstroms and the second chromium layer was 100 angstroms. After metal deposition, photolithography was used to pattern these structures using a mask. The top surface was first spin coated with HMDS followed by AZ5214 spin coating at 4000 rpm for 40 seconds. The sample was then soft-baked at 90° C. for 20 minutes. The source-drain was patterned using a Karl Suss MA6 Aligner. The exposure time was 71.5 seconds and the light fluence was 2.0 mW/cm. The electrodes were developed for 60 seconds in 1:1 AZ512 developer:DI water, rinsed in DI water and baked at 115° C. for 20 minutes. The unwanted source-drain material was removed with a mixture of 85 ml phosphoric acid: 5 ml DI water: 5 ml acetic acid: 5 ml nitric acid. The sample was washed thoroughly with DI water and hard baked at 115° C. for 20 minutes. Etching conditions were 150 mbar, 16 sccm CF4 and 0.12 w/cm² for a total 7 minutes in one minute intervals. The mask photoresist layer was removed using acetone in an ultrasonic cleaning bath.

The transistor islands were patterned using the Karl Suss MA6 Aligner using a third mask using photolithography. The top surface was first spin coated with HMDS, followed by AZ5214 photoresist and spin coating at 4000 rpm for 40 seconds. The sample was then soft-baked at 90° C. for 20 minutes. The exposure time was 71.5 seconds and the light fluence was 2.0 mW/cm. The transistor islands pattern was developed for 60 seconds in 1:1 AZ 512 developer: DI water, rinsed in DI water and baked at 115° C. for 20 minutes. The a-Si:H layer was etched using a Plasma-Therm 790 System VII. Etching conditions were 150 mbar, 16 sccm CF4, and 0.12 w/cm$^2$ for a total 42 minutes in two minute intervals. The remaining photoresist layer was removed using acetone in an ultrasonic cleaning bath. The electrical characteristics were measured using a HP 4155A Semiconductor Analyzer with the substrates on a probe station inside a metal box to exclude light.

The sample was then coated two times with Photoresist AZ5214 on the device side, placed on a hot plate at 105° C. for one minute and then baked for 20 minutes at 90° C. for 20 minutes. The sample was then placed in the Plasmatherm 790 and RIE etched for a total of 16 minutes. Etching conditions were 100 mbar, 35 sccm CF4 and 5 sccm 02 and 0.16 w/cm$^2$ for a total 16 minutes in two eight minute intervals.

The sample was annealed in a mixture of 15% H2 in N2 gas (forming gas) for 66 minutes in an annealing apparatus. A thermocouple was placed outside of the annealing apparatus and the annealing apparatus was placed in a tube furnace. The temperature, while the sample was exposed to a flow of the forming gas at 1 atm, was ramped to 195° C.

The electrical characteristics were compared to the characteristics of a backplane having a glass substrate and formed under identical conditions. As shown in Table 1, the thin-film transistor array formed on the Kapton substrate has substantially identical characteristics as the glass substrate.

TABLE 1

Comparison of TFT characteristics between Kapton and glass substrates

| Parameter/Substrate | Kapton | Glass |
| --- | --- | --- |
| Linear Threshold Voltage | 1.5 V | 1.3 V |
| Linear Mobility | 0.54 cm$^2$V$^{-1}$s$^{-1}$ | 0.61 cm$^2$V$^{-1}$s$^{-1}$ |
| Saturated Threshold Voltage | 1.4 V | 1.3 V |
| Saturated Mobility | 0.54 cm$^2$V$^{-1}$s$^{-1}$ | 0.64 cm$^2$V$^{-1}$s$^{-1}$ |
| Off Current | 3 × 10$^{-12}$ A | 2 × 10$^{-12}$ A |
| On/off ratio | 3 × 10$^6$ | 5 × 10$^6$ |

It will thus be seen that the invention efficiently attains the objects set forth above, among those made apparent from the preceding description. Since certain changes may be made in the above constructions without departing from the scope of the invention, it is intended that all matter contained in the above description or shown in the accompanying drawings be interpreted as illustrative and not in a limiting sense.

It is also to be understood that the following claims are to cover all generic and specific features of the invention described herein, and all statements of the scope of the invention which, as a matter of language, might be said to fall therebetween.

Having described the invention, what is claimed as new and desired to be secured by Letters Patent is:

1. A portable electronic device comprising,
   a housing to house a portion of one or more components of said portable electronic device; and
   a display assembly coupled to a flexible backplane assembly for displaying content to a user of the portable electronic device, the flexible backplane assembly has formed thereon at least one transistor having at least one layer of amorphous silicon, wherein the flexible backplane assembly including the at least one transistor being capable of flexing in one or more dimensions to change a topography of a surface of the flexible backplane assembly, and wherein a portion of the display assembly forms a portion of the housing.

2. The portable electronic device of claim 1, wherein the display assembly comprises a flexible display medium having a plurality of pixels capable of displaying content to the user of the portable electronic device and capable of flexing to change a topography of a surface of the flexible display assembly.

3. The portable electronic device of claim 2, wherein the flexible display assembly comprises,
   a flexible layer of transparent material disposed over a portion of the flexible display medium.

4. The portable electronic device of claim 3, wherein the flexible display medium comprises, a bi-stable, non-volatile display medium.

5. The portable electronic device of claim 4, wherein the flexible display medium comprises,
   electrophoretic material having a pattern of addressable pixel locations; and
   an activation grid for supplying a charge to selected addressable pixel locations to form the content for displaying to the user.

6. The portable electronic device of claim 4, wherein the flexible display medium comprises at least one of a plurality of bichromal spheres, a plurality of pneumatic liquid crystals, a plurality of cholesteric liquid crystals, and a plurality of chiral compounds.

7. The portable electronic device of claim 3, wherein the flexible display medium comprises a volatile medium.

8. The portable electronic device of claim 7, wherein the volatile medium comprises at least one of, an organic light emitting diode, a liquid crystal, and a polymer dispersed liquid crystal.

9. The portable electronic device of claim 3, wherein the flexible display medium comprises a medium that includes at least one of a surface stabilized ferroelectric liquid crystal, a fast multi stable liquid crystal, and OYNX™ chemical substance.

10. The portable electronic device of claim 2, wherein the flexible display assembly is capable of having a first portion of the surface of the flexible display assembly flex to conform to a first radius and a second portion of the surface of the flexible display assembly flex to conform to a second radius.

11. The portable electronic device of claim 1, wherein the flexible backplane assembly comprises a matrix of transistors formed on a flexible polyimide substrate.

12. The portable electronic device of claim 1, wherein the housing comprises, a moveable member moveable from a first position to a second position to access a portion of the portable electronic device.

13. The portable electronic device of claim 1, wherein the portable electronic device comprises at least one of, a personal digital assistant (PDA), a cell phone, a timepiece, and a mobile electronic device associated with a network.

14. A flexible electronic display having a plurality of pixels, the flexible electronic display comprising,
   a flexible display medium for displaying indicia to an operator, the flexible display medium having a first surface adjacent to a transparent reference electrode layer and a second surface adjacent to at least one thin film transistor having at least one layer of amorphous silicon, the indicia providing the operator with indications of a state of a monitored process; and wherein the at least one thin film transistor being formed on a substrate capable of flexing in a plurality of dimensions, the at least one thin film transistor, the transparent reference electrode layer, and the flexible display medium flex to adapt to one or more contours of a surface of an instrument panel at least during mounting of said flexible electronic display thereto.

15. The flexible electronic display of claim 14, further comprising a device coupled to the at least one thin film transistor, the device providing the at least one thin film transistor with an input for rendering on said flexible display medium, the input including at least a response from a stimulus.

16. The flexible electronic display of claim 15, further comprising one or more decoder circuits coupled between the at least one thin film transistor and said device, the one or more decoder circuits capable of selecting a plurality of transistors to address a selected pixel of said plurality of pixels of said flexible electronic display in response to said input from said device.

17. The flexible electronic display of claim 14, wherein the instrument panel is mounted in a mechanized vehicle.

18. The flexible electronic display of claim 16, wherein the mechanized vehicle includes at least one of an automobile, a locomotive, an airplane, a motorcycle, a watercraft, and a truck.

19. The flexible electronic display of claim 14, wherein the instrument panel is incorporated into a device for determining a present value of a quantity under observation.

20. The flexible electronic display of claim 14, wherein the plurality of pixel elements are capable of maintaining state in an absence of a selected input to said flexible display medium.

21. The flexible electronic display of claim 20, wherein the plurality of pixel elements are formed of a compound that includes at least one of, an electronic ink, an electrophoretic material, a plurality of bichromal spheres, a plurality of nematic liquid crystals, a plurality of cholesteric liquid crystals, and a plurality of chiral compounds.

22. The flexible electronic display of claim 21, wherein the electronic ink comprises a compound formed from a plurality of particles, each of the plurality of particles is capable of entering one of two states to form a bi-stable imaging medium, wherein a first of the two states orients a selected one of the plurality of particles to reflect light and a second of the two states orients the selected one of the plurality of particles to absorb light.

23. The flexible electronic display of claim 21, wherein the electronic ink comprises at least one of, a plurality of bichromal spheres, a plurality of nematic liquid crystals, a plurality of cholesteric liquid crystals, and a plurality of chiral compounds.

24. The flexible electronic display of claim 21, wherein the electrophoretic material comprises at least one of, a plurality of bichromal spheres, a plurality of nematic liquid crystals, a plurality of cholesteric liquid crystals, and a plurality of chiral compounds.

25. The flexible electronic display of claim 24, wherein the plurality of pixel elements are formed of a compound that includes at least one of, an organic light emitting diode, a liquid crystal, and a polymer dispersed liquid crystal.

26. The display device of claim 25, further comprising a transponder layer coupled to the matrix of transistors for performing radio frequency identification (RFID).

27. The display device of claim 25, wherein the matrix of transistors and the plurality of pixels form a portion of an electronic label employing electronic ink.

28. The flexible electronic display of claim 21, wherein the electronic ink comprises conductive ink having an arrangement of particles, each of the particles has disposed therein an electrophoretic composition of a fluid and a suspension of colloidal material, the conductive ink being printable on an a medium by an image reproducing system.

29. The flexible electronic display of claim 14, wherein the plurality of pixel elements cause the flexible display medium to change state when a selected input to said flexible display medium is interrupted.

30. The flexible electronic display of claim 14, wherein the plurality of pixel elements cause the flexible display medium to become randomly dispersed when a selected input to said flexible display medium is interrupted.

31. The flexible electronic display of claim 14, wherein the plurality of pixel elements cause the flexible display medium to power off when a selected input to said flexible display medium is interrupted.

32. The flexible electronic display of claim 14, wherein the flexible display medium comprises a plurality of pixel elements formed of a compound that includes at least one of, a surface stabilized ferroelectric liquid crystal, a fast multi stable liquid crystal, and an OYNX™ chemical compound.

33. A display device for displaying content to a user, said display device comprising, a matrix of transistors formed on a flexible substrate, the flexible substrate capable of flexing in one or more dimensions with the transistors formed thereon to adapt to a desired contour, and a plurality of pixels coupled to the matrix of transistors, each of the plurality of pixels being addressable by the matrix of transistors to transfer a charge from a selected one of the matrix of transistors to one of the plurality of pixels to display a portion of the content to the user.

34. The display device of claim 33, wherein the flexible substrate comprises a polyimide material.

35. The display device of claim 33, wherein the matrix of transistors comprises a plurality of thin film transistors having at least one layer of amorphous silicon.

36. The display device of claim 33, wherein each of the plurality of pixels is coupled to at least one capacitor, the capacitor holding the charge transferred to the selected pixel from the matrix of transistors.

37. The display device of claim 36, wherein the transistor that passes the charge to cause the selected pixel to change state is constructed on a polyimide material in a plurality of geometric patterns.

38. The display device of claim 37, wherein the plurality of geometric patterns comprises a plurality of two dimensional shapes.

39. The display device of claim 33, wherein the plurality of pixels are formed of a compound that includes at least one of an electronic ink with a plurality of bichromal spheres, a electrophoretic material with a plurality of microencapsulated bichromal spheres, a electrophoretic material with particles micro encapsulated in a suspension fluid of a contrasting color, a plurality of nematic liquid crystals, a plurality of cholesteric liquid crystals, and a plurality of chiral compounds.

40. The display device of claim 39, wherein each of the materials comprises a compound formed from a plurality of particles, each of the plurality of particles is capable of entering one of two states to form a bi-stable imaging medium, wherein a first of the two states orients a selected one of the plurality of particles to reflect light and a second of the two states orients the selected one of the plurality of particles to absorb light, to reflect light, or to absorb light of different frequencies thereby creating contrasting colors.

41. The display device of claim 39, wherein the electronic ink comprises conductive ink having an arrangement of particles, each of the particles has disposed therein an electrophoretic composition of a fluid and a suspension of colloidal material, the conductive ink being printable on an a medium by an image reproducing system.

42. The display device of claim 33, wherein the plurality of pixels change state when a selected input to said display device is interrupted.

43. The display device of claim 33, wherein the plurality of pixels are formed of material that includes at least one of an organic light emitting diode, a liquid crystal, and a polymer dispersed liquid crystal.

44. The display device of claim 33, wherein the plurality of pixels comprises a compound formed with at least one of, a surface stabilized ferroelectric liquid crystal, a fast multi stable liquid crystal, and an OYNX™ chemical compound.

45. The display device of claim 33, further comprising a transparent layer of conductive material disposed over a surface of each of the plurality of pixels to form an electrode for selecting one of the plurality of pixels.

46. The display device of claim 45, wherein a pointing device passes over a portion of the electrode to select at least one of the plurality of pixels corresponding to the selected portion of the electrode.

47. The display device of claim 33, wherein the display device displays content from a stored location, the stored location present in a portion of the display device.

48. The display device of claim 33, further comprising a processor coupled to the matrix of transistors, the processor producing and driving the matrix of transistors with a portion of the content said display device displays.

49. The display device of claim 33, wherein a portion of the content said display device displays is provided by an electronic device associated with a network.

* * * * *